(12) United States Patent
Hsiao et al.

(10) Patent No.: US 11,244,896 B2
(45) Date of Patent: Feb. 8, 2022

(54) PACKAGE STRUCTURE AND MANUFACTURING METHOD THEREOF

(71) Applicant: Taiwan Semiconductor Manufacturing Co., Ltd., Hsinchu (TW)

(72) Inventors: Min-Chien Hsiao, Taichung (TW); Chuei-Tang Wang, Taichung (TW); Chao-Wen Shih, Hsinchu County (TW); Han-Ping Pu, Taichung (TW); Chieh-Yen Chen, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 84 days.

(21) Appl. No.: 16/258,652

(22) Filed: Jan. 27, 2019

(65) Prior Publication Data
US 2020/0243441 A1    Jul. 30, 2020

(51) Int. Cl.
| | |
|---|---|
| *H01L 23/522* | (2006.01) |
| *H01L 29/10* | (2006.01) |
| *H01L 29/66* | (2006.01) |
| *H01L 23/00* | (2006.01) |
| *H01L 23/31* | (2006.01) |
| *H01L 23/528* | (2006.01) |
| *H01L 29/739* | (2006.01) |
| *H01L 23/66* | (2006.01) |
| *H01L 21/56* | (2006.01) |
| *H01L 21/683* | (2006.01) |

(52) U.S. Cl.
CPC ........ *H01L 23/5226* (2013.01); *H01L 21/561* (2013.01); *H01L 23/3128* (2013.01); *H01L 23/5283* (2013.01); *H01L 24/09* (2013.01); *H01L 24/17* (2013.01); *H01L 24/33* (2013.01); *H01L 24/73* (2013.01); *H01L 24/97* (2013.01); *H01L 29/1095* (2013.01); *H01L 29/66348* (2013.01); *H01L 29/7393* (2013.01); *H01L 2224/0231* (2013.01); *H01L 2224/02373* (2013.01); *H01L 2224/02379* (2013.01)

(58) Field of Classification Search
CPC ............. H01L 23/5226; H01L 23/3114; H01L 2224/02373; H01L 2224/02379; H01L 24/97; H01L 23/5283; H01L 23/528; H01L 23/3128; H01L 24/17
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |

(Continued)

*Primary Examiner* — Marcos D. Pizarro
*Assistant Examiner* — Antonio B Crite
(74) *Attorney, Agent, or Firm* — JCIPRNET

(57) ABSTRACT

A package structure includes a die, an encapsulant, and a first redistribution structure. The die has an active surface and a rear surface opposite to the active surface. The die includes a ground plane within the die. The encapsulant encapsulates the die. The first redistribution structure is over the active surface of the die. The first redistribution structure includes an antenna pattern electrically coupled with the ground plane. The antenna pattern is electrically connected to the die.

20 Claims, 45 Drawing Sheets

(56) References Cited

U.S. PATENT DOCUMENTS

| | | |
|---|---|---|
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2018/0337148 A1* | 11/2018 | Baek ........................ H01L 23/66 |

* cited by examiner

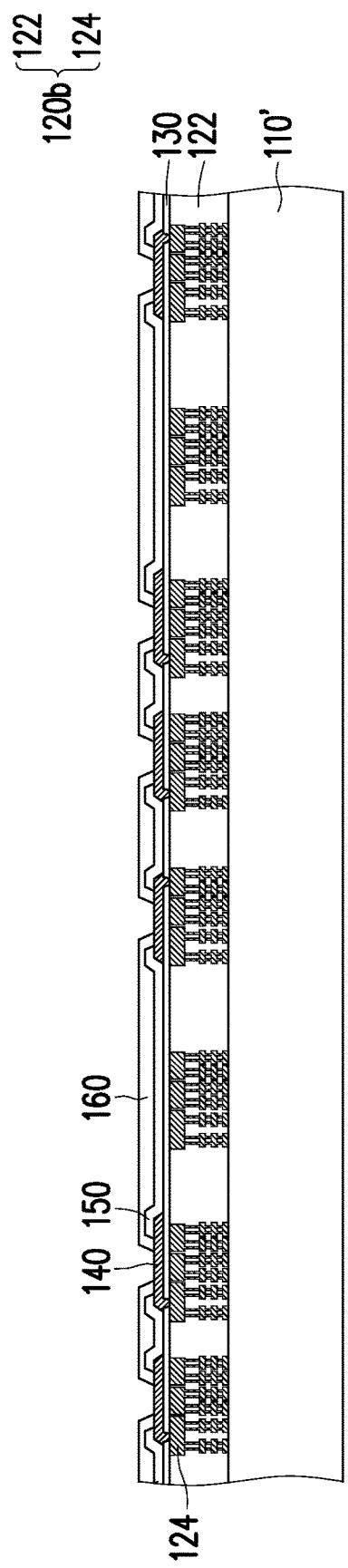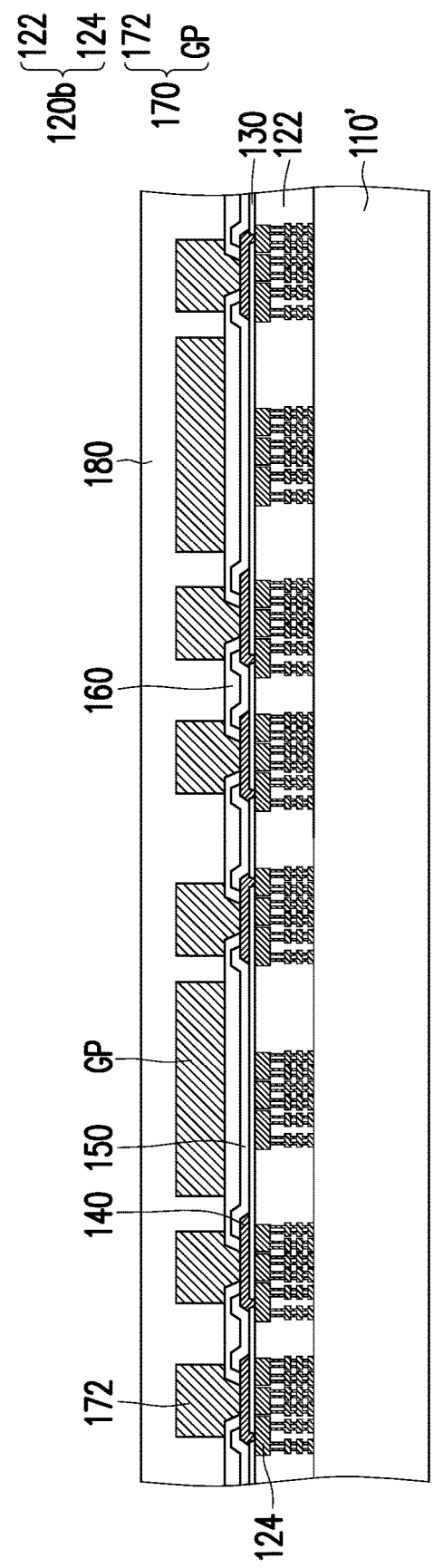

PACKAGE STRUCTURE AND MANUFACTURING METHOD THEREOF

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices (e.g. antenna) or dies at the wafer level, and various technologies have been developed for the wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A to FIG. 2L are schematic cross-sectional views illustrating a manufacturing process of a package structure in accordance with some alternative embodiments of the disclosure.

DETAILED DESCRIPTION

Figure 1A:
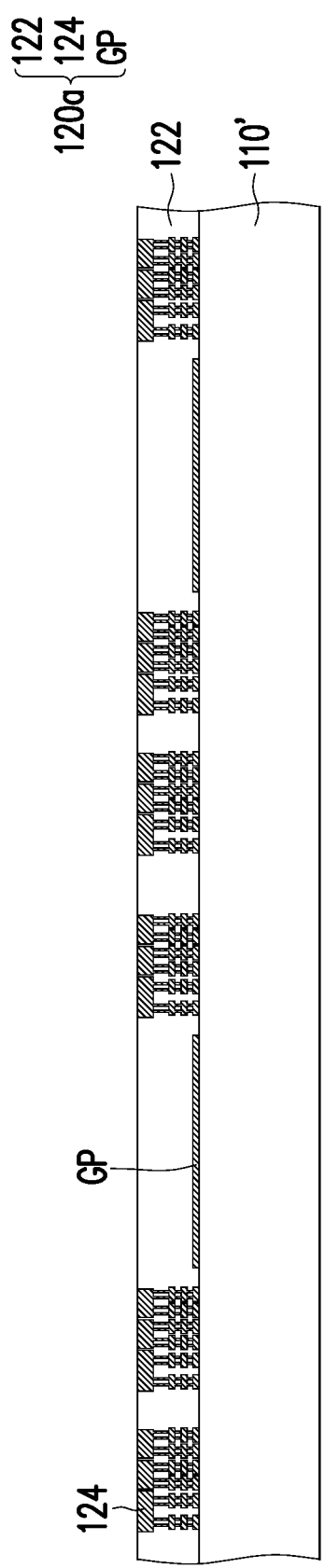
FIG. 1A to FIG. 1L are schematic cross-sectional views illustrating a manufacturing process of a package structure in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1L are schematic cross-sectional views illustrating a manufacturing process of a package structure 10 in accordance with some embodiments of the disclosure. Referring to FIG. 1A, a semiconductor wafer 110' is provided. In some embodiments, the semiconductor wafer 110' may be made of a suitable elemental semiconductor, such as crystalline silicon, diamond, or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. In some embodiments, the semiconductor wafer 110' has active components (e.g., transistors or the like) and passive components (e.g., resistors, capacitors, inductors, or the like) formed therein.

In some embodiments, an interconnection structure 120a is formed on the semiconductor wafer 110'. In some embodiments, the interconnection structure 120a includes an inter-dielectric layer 122, a plurality of patterned conductive layers 124, and a plurality of ground planes GP. For simplicity, the inter-dielectric layer 122 is illustrated as a bulky layer in FIG. 1A, but it should be understood that the inter-dielectric layer 122 may be constituted by multiple dielectric layers. The patterned conductive layers 124 and the dielectric layers of the inter-dielectric layer 122 are stacked alternately. In some embodiments, two adjacent patterned conductive layers 124 are electrically connected to each other through conductive vias sandwiched therebetween.

In some embodiments, a material of the inter-dielectric layer 122 includes polyimide, epoxy resin, acrylic resin, phenol resin, benzocyclobutene (BCB), polybenzoxazole (PBO), or other suitable polymer-based dielectric materials. The inter-dielectric layer 122, for example, may be formed by suitable fabrication techniques such as spin-on coating, chemical vapor deposition (CVD), plasma-enhanced chemical vapor deposition (PECVD), or the like. In some embodiments, a material of the patterned conductive layers 124 and the ground planes GP includes aluminum, titanium, copper, nickel, tungsten, and/or alloys thereof. The patterned conductive layers 124 and the ground planes GP may be formed by, for example, electroplating, deposition, and/or photolithography and etching. In some embodiments, the ground planes GP and one of the patterned conductive layers 124 are simultaneously formed. For example, the ground planes GP and the bottommost patterned conductive layer 124 may be formed by a same photolithography and etching process at the same time. As such, the ground planes GP and the bottommost patterned conductive layer 124 are located at a same level and are considered as a same layer. In some embodiments, the ground planes GP are electrically insulated from the patterned conductive layers 124. In some embodiments, the ground planes GP are electrically connected to a ground. It should be noted that the number of the patterned conductive layers 124 and the dielectric layers in the inter-dielectric layer 122 shown in FIG. 1A is merely an exemplary illustration, and the disclosure is not limited. In some alternative embodiments, the number of the patterned conductive layers 124 and the dielectric layers in the inter-dielectric layer 122 may be adjusted depending on the routing requirements.

Figure 1B:
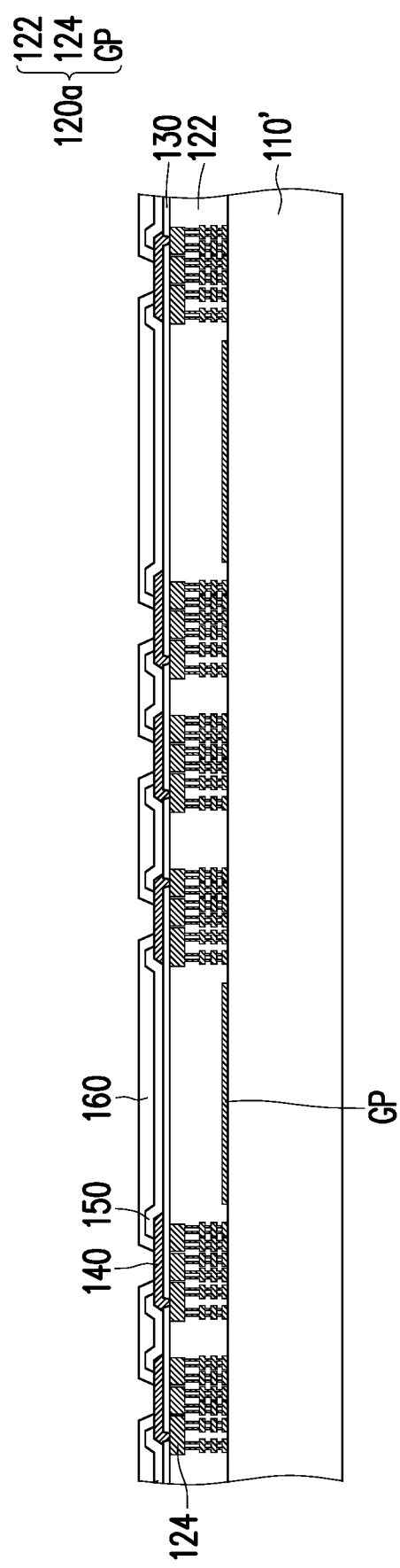

Referring to FIG. 1B, a dielectric layer 130 is formed over the interconnection structure 120a. In some embodiments, a material of the dielectric layer 130 includes polyimide, epoxy resin, acrylic resin, phenol resin, BCB, PBO, or any other suitable polymer-based dielectric material. The dielectric layer 130, for example, may be formed by suitable fabrication techniques such as spin-on coating, CVD, PECVD, or the like. In some embodiments, a plurality of openings is formed in the dielectric layer 130 to expose portions of the topmost patterned conductive layer 124. After the openings are formed, a plurality of conductive pads 140 is formed over the dielectric layer 130. For example, the conductive pads 140 are formed such that the interconnection structure 120a is located between the semiconductor wafer 110' and the conductive pads 140. In some embodiments, the locations of the conductive pads 140 correspond to the locations of the openings of the dielectric layer 130. For example, the conductive pads 140 may extend into the openings of the dielectric layer 130 to render electrical connection between the conductive pads 140 and portions of the interconnection structure 120a (i.e. the patterned conductive layer 124). In some embodiments, the conductive pads 140 may be aluminum pads, copper pads, or other suitable metal pads. The number and shape of the conductive pads 140 may be selected based on demand.

After the conductive pads 140 are distributed over the dielectric layer 130, a passivation layer 150 and a post-passivation layer 160 are sequentially formed over the dielectric layer 130 and the conductive pads 140. In some embodiments, the passivation layer 150 has a plurality of contact openings which partially exposes the conductive pads 140. In some embodiments, the passivation layer 150 may be a silicon oxide layer, a silicon nitride layer, a silicon oxy-nitride layer, or a dielectric layer formed by other suitable dielectric materials. As illustrated in FIG. 1B, the post-passivation layer 160 covers the passivation layer 150 and has a plurality of contact openings. The conductive pads 140 are partially exposed from the contact openings of the post-passivation layer 160. In some embodiments, the post-passivation layer 160 may be a polyimide layer, a PBO layer, or a dielectric layer formed by other suitable polymers. It should be noted that the post-passivation layer 160 may be optional in some embodiments.

Figure 1C:
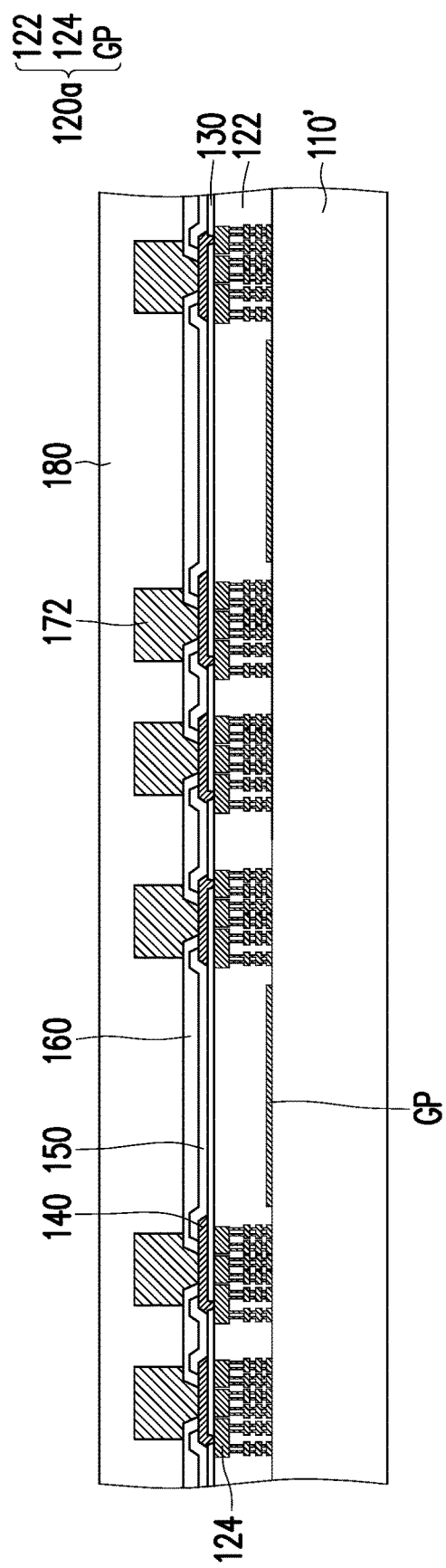

Referring to FIG. 1C, a plurality of conductive posts 172 are formed over the conductive pads 140. In some embodiments, the conductive posts 172 are plated on the conductive pads 140. For example, the conductive posts 172 may be formed by the following steps. First, a seed layer (not shown) may be sputtered onto the post-passivation layer 160 and the revealed portion of the conductive pads 140. In some embodiments, the seed layer includes titanium, copper, or a combination thereof. A patterned mask layer (not shown) may be then formed over the seed layer by photolithography. The patterned mask layer reveals portions of the seed layer that correspond to the conductive pads 140. The semiconductor wafer 110' including the patterned mask layer formed thereon may be immersed into a plating solution in a plating bath such that a conductive material (not shown) is plated on the portions of the seed layer revealed by the patterned mask layer. In some embodiments, the conductive material includes, for example, aluminum, titanium, copper, nickel, tungsten, and/or alloys thereof. After forming the conductive material, the patterned mask layer is stripped. Thereafter, by using the conductive material as a hard mask, portions of the seed layer that are not covered by the conductive material may be removed through etching until the post-passivation layer 160 is revealed. The conductive material and the remaining seed layer then forms the conductive posts 172.

After the conductive posts 172 are plated onto the conductive pads 140, a protection layer 180 is formed over the post-passivation layer 160 to encapsulate the conductive posts 172. For example, the conductive posts 172 are well protected by the protection layer 180 and are not revealed. In some embodiments, a material of the protection layer 180 has a low dissipation factor (Df) and/or a low permittivity (Dk). Depending on the frequency range of the high-speed application, suitable material for the protection layer 180 may be selected based on the required electrical properties of the subsequently formed package structure. For example, the protection layer 180 may include polymer, epoxy, the like, or a combination thereof. In some embodiments, the protection layer 180 is formed by a suitable fabrication technique, such as spin-coating, lamination, deposition, molding, or the like.

Figure 1D:
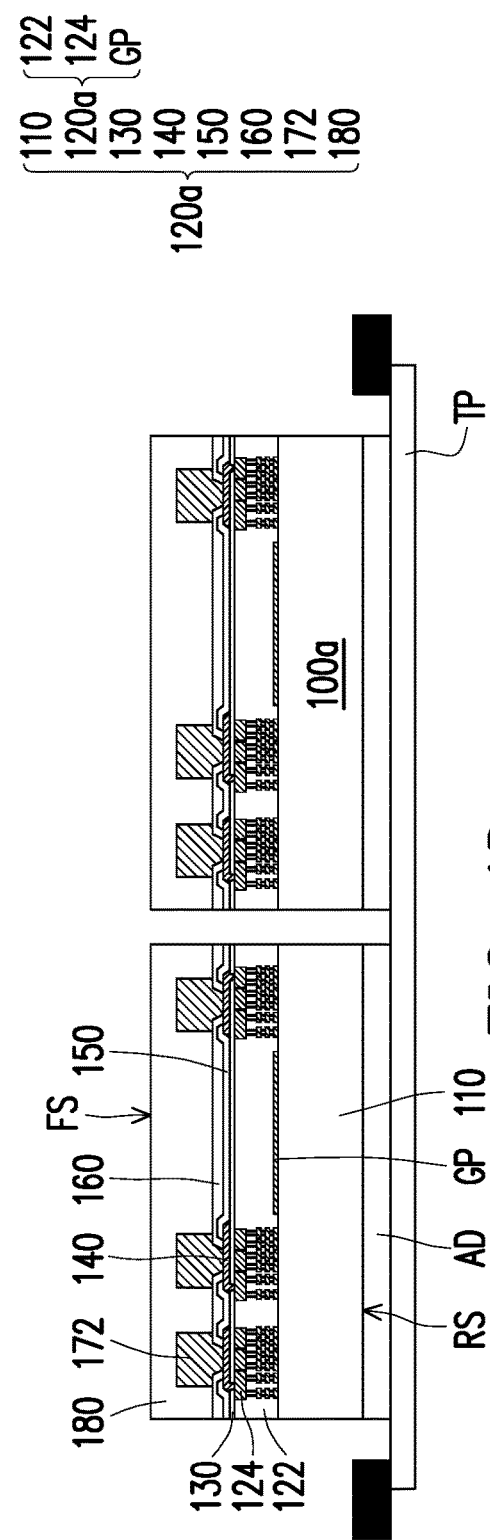

Referring to FIG. 1C and FIG. 1D, the structure illustrated in FIG. 1C may be singulated to render a plurality of dies 100a shown in FIG. 1D. In some embodiments, the singulation process typically involves dicing with a rotation blade and/or a laser beam. In other words, the singulation process includes a laser cutting process, a mechanical cutting process, a laser grooving process, other suitable processes, or a combination thereof. For example, a laser grooving process may be performed on the structure illustrated in FIG. 1C to form a trench (not shown) in the said structure. Thereafter, a mechanical cutting process may be performed on the location of the trench to cut through the said structure, so as to divide the semiconductor wafer 110' into semiconductor substrates 110 and to obtain the dies 100a.

In some embodiments, each die 100a includes the semiconductor substrate 110, the interconnection structure 120a, the dielectric layer 130, the conductive pads 140, the passivation layer 150, the post-passivation layer 160, the conductive posts 172, and the protection layer 180. The interconnection structure 120a, the dielectric layer 130, and the conductive pads 140 are sequentially formed over the semiconductor substrate 110. The conductive posts 172 stands on the conductive pads 140 and the protection layer 180 encapsulates the conductive posts 172. In some embodiments, the interconnection structure 120a includes the inter-dielectric layer 122, the patterned conductive layers 124, and the ground planes GP. That is, the ground planes GP are within the die 100a. In some embodiments, each die 100a has a front surface FS and a rear surface RS opposite to the front surface FS. As illustrated in FIG. 1D, the dies 100a are placed on a tape TP for further processing. For example, a cleaning process may be performed on the dies 100a to remove impurities generated during the fabrication process of the dies 100a. In some embodiments, the rear surface RS of each die 100a is attached to an adhesive layer AD. In some embodiments, the adhesive layer AD may include a die attach film (DAF) or other materials having adhesion property.

Figure 1E:
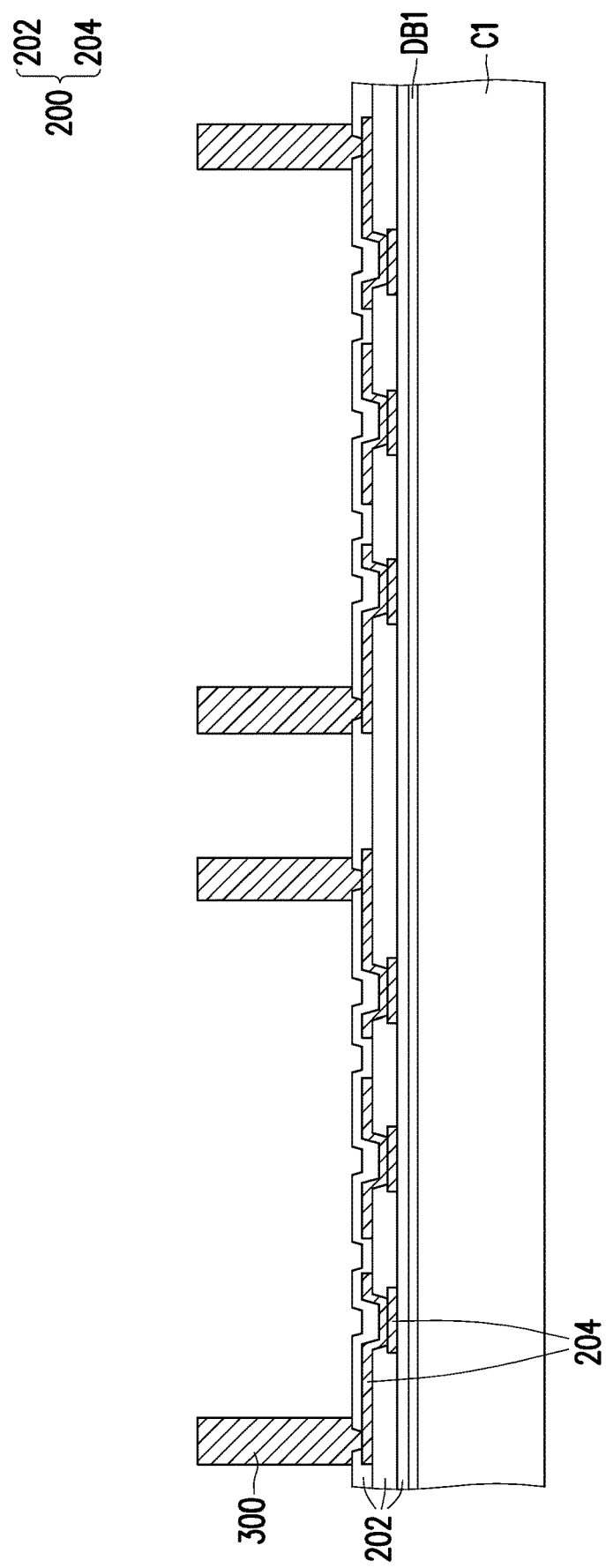

Referring to FIG. 1E, a carrier C1 having a de-bonding layer DB1 formed thereon is provided. In some embodiments, the carrier C1 is a glass substrate. However, other suitable materials may be adapted as a material of the carrier C1 as long as the material is able to withstand the subsequent processes while carrying the package structure formed thereon. In some embodiments, the de-bonding layer DB1 is a light-to-heat conversion (LTHC) release layer formed on the glass substrate. The de-bonding layer DB1 may allow the structure formed on the carrier C1 in the subsequent processes to be peeled off from the carrier C1.

As illustrated in FIG. 1E, a redistribution structure 200 and a plurality of conductive structures 300 are formed over the de-bonding layer DB. In some embodiments, the redistribution structure 200 includes a plurality of dielectric layers 202 and a plurality of redistribution circuit patterns 204 stacked alternately. In some embodiments, the redistribution circuit patterns 204 are interconnected with one another.

The method of forming the redistribution structure 200 may include the following steps. First, the bottommost dielectric layer 202 may be formed on the de-bonding layer DB. In some embodiments, a material of the dielectric layer 202 includes polyimide, epoxy resin, acrylic resin, phenol resin, benzocyclobutene (BCB), polybenzooxazole (PBO), or any other suitable polymer-based dielectric material. The dielectric layer 202, for example, may be formed by suitable fabrication techniques such as spin-on coating, chemical vapor deposition (CVD), plasma-enhanced chemical vapor deposition (PECVD), or the like. Thereafter, a seed material layer (not shown) is blanketly formed over the bottommost dielectric layer 202. In some embodiments, the seed material layer includes a titanium/copper composite layer and is formed by a sputtering process. Then, a mask pattern (not shown) having openings is formed on the seed material layer. The openings of the mask pattern expose the intended location for the subsequently formed redistribution circuit patterns 204. Afterwards, a plating process is performed to form a conductive material layer on the seed material layer exposed by the openings of the mask pattern. In some embodiments, a material of the conductive material layer includes aluminum, titanium, copper, nickel, tungsten, and/or alloys thereof. The mask pattern and the underlying seed material layer are then removed by a stripping process and an etching process. The remaining seed material layer and the conductive material layer then constitute the bottommost redistribution circuit patterns 204. After forming the bottommost dielectric layer 202 and the bottommost redistribution circuit patterns 204, another dielectric layer 202 may be formed over the bottommost dielectric layer 202 and the bottommost redistribution circuit patterns 204. Subsequently, a plurality of contact openings is formed in such dielectric layer 202 to expose the bottommost redistribution circuit patterns 204. Then, the step of forming the seed material layer and the conductive material layer presented above may be repeated to render the redistribution circuit patterns 204 above the bottommost redistribution circuit patterns 204. The foregoing step then may be repeated several times to obtain the redistribution structure 200 having multiple layers.

It should be noted that although two layers of the redistribution circuit patterns 204 and three layers of the dielectric layers 202 are illustrated in FIG. 1E, the number of these layers is not limited thereto. In some alternative embodiments, the redistribution structure 200 may be constituted by more or less layers of the dielectric layer 202 and the redistribution circuit patterns 204 depending on the circuit design.

The conductive structures 300 are formed over the redistribution structure 200. In some embodiments, the conductive structures 300 are electrically connected to the redistribution structure 200. The conductive structures 300 may be formed by the following process. First, the topmost dielectric layer 202 of the redistribution structure 200 is patterned to form a plurality of contact openings exposing at least a portion of the topmost redistribution circuit patterns 204. Subsequently, a seed material layer (not shown) is formed over the topmost dielectric layer 202 and over the topmost redistribution circuit pattern 204 exposed by the contact openings. In some embodiments, the seed material layer includes a titanium/copper composite layer and is formed by a sputtering process. Thereafter, a mask pattern (not shown) with openings is formed on the seed material layer. The openings of the mask pattern expose the intended locations for the subsequently formed conductive structures 300. Afterwards, a plating process is performed to form a metal material layer (e.g., a copper layer) on the seed material layer exposed by the openings of the mask pattern. The mask pattern and the underlying seed material layer are then removed to form the conductive structures 300. However, the disclosure is not limited thereto. In some alternative embodiments, other suitable methods may be utilized to form the conductive structures 300. For example, pre-fabricated conductive structures 300 may be picked and placed onto the redistribution structure 200.

Figure 1F:
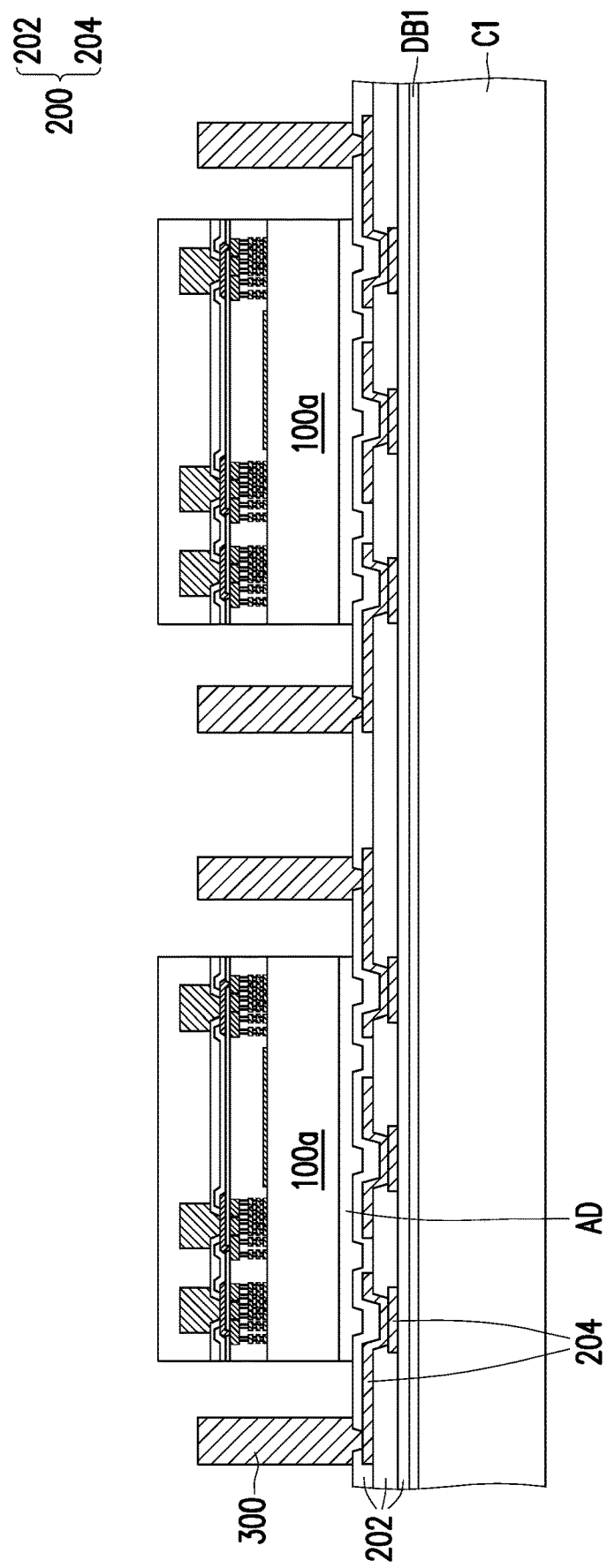

Referring to FIG. 1F, the dies 100a having the adhesive layer AD attached thereto are picked and placed onto the redistribution structure 200. In some embodiments, the dies 100a are placed such that the conductive structures 300 surround each die 100a. In some embodiments, due to the contour of the topmost redistribution circuit patterns 204 and the topmost dielectric layer 202, the redistribution structure 200 may not have a flat top surface and a plurality of dents may be found on the top surface of the redistribution structure 200. Upon placing the dies 100a, a side of the adhesive layer AD is fill into the dents while maintaining flatness on another side. As such, the adhesive layer AD may also function as a buffer layer and the dies 100a may be considered as being formed on a flat surface. Although FIG. 1E and FIG. 1F illustrated that the conductive structures 300 are formed prior to the placement of the dies 100a, the disclosure is not limited thereto. In some alternative embodiments, the dies 100a may be placed before the conductive structures 300 are formed on the redistribution structure 200.

Figure 1G:
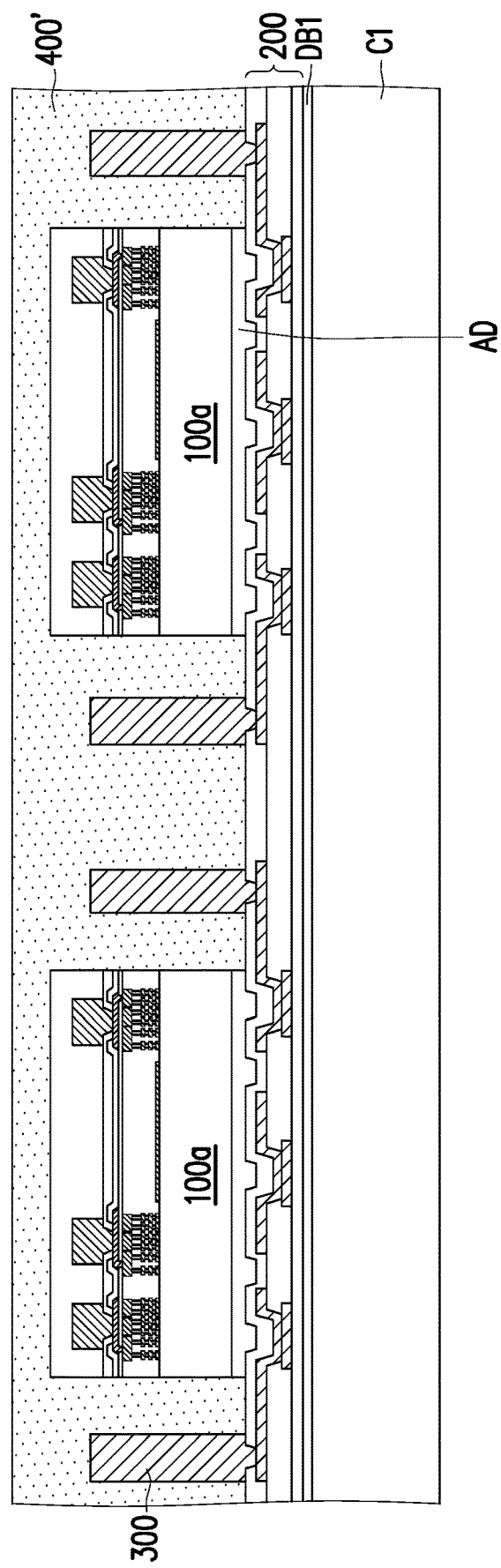

Referring to FIG. 1G, an encapsulation material 400' is formed over the redistribution structure 200 to encapsulate the conductive structures 300 and the dies 100a. For example, the conductive structures 300 and the protection layer 180 of the dies 100a are encapsulated by the encapsulation material 400'. In other words, the conductive structures 300 and the protection layer 180 of the dies 100a are not revealed and are well protected by the encapsulation material 400'. In some embodiments, the encapsulation material 400' includes a molding compound, a molding underfill, a resin (such as epoxy), or the like. In some embodiments, the encapsulation material 400' may include fillers. In some embodiments, the encapsulation material 400' may be formed by a molding process. For example, the encapsulation material 400' may be formed by a compression molding process.

Figure 1H:
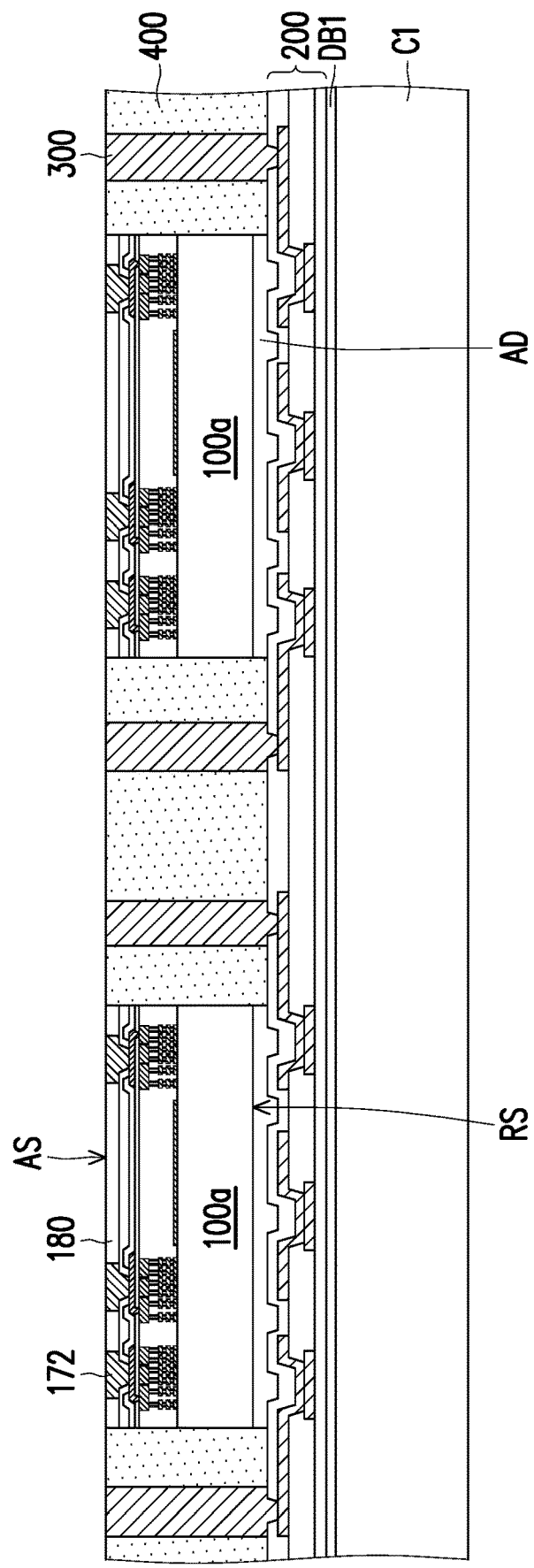

Referring to FIG. 1G and FIG. 1H, the encapsulation material 400' and the protection layer 180 of the dies 100a are grinded until top surfaces of the conductive posts 172 and top surfaces of the conductive structures 300 are exposed. After the encapsulation material 400' is grinded, an encapsulant 400 is formed over the redistribution structure 200 to encapsulate the conductive structures 300 and the dies 100a. In some embodiments, the encapsulation material 400' is grinded by a mechanical grinding process and/or a chemical mechanical polishing (CMP) process. In some embodiments, during the grinding process of the encapsulation material 400', the protection layer 180 are grinded to reveal the conductive posts 172. In some embodiments, portions of the conductive posts 172 and portions of the conductive structures 300 are slightly grinded as well. After grinding, each die 100a has an active surface AS opposite to the rear surface RS. The exposed portion of the conductive posts 172 is located on the active surfaces AS of the dies 100a. In some embodiments, the encapsulant 400 encapsulates sidewalls of the dies 100a and sidewalls of the conductive structures 300. In other words, the dies 100a and the conductive structures 300 are embedded in the encapsulant 400. For example, the conductive structures 300 penetrate through the encapsulant 400. In some embodiments, top surfaces of the conductive structures 300, top surfaces of the conductive posts 172a, and a top surface of the protection layer 180 are substantially coplanar with a top surface of the encapsulant 400. It is noted that since the redistribution structure 200 is located over the rear surface RS of the dies 100a, the redistribution structure 200 may be referred to as a "backside redistribution structure" in some embodiments.

Figure 1I:
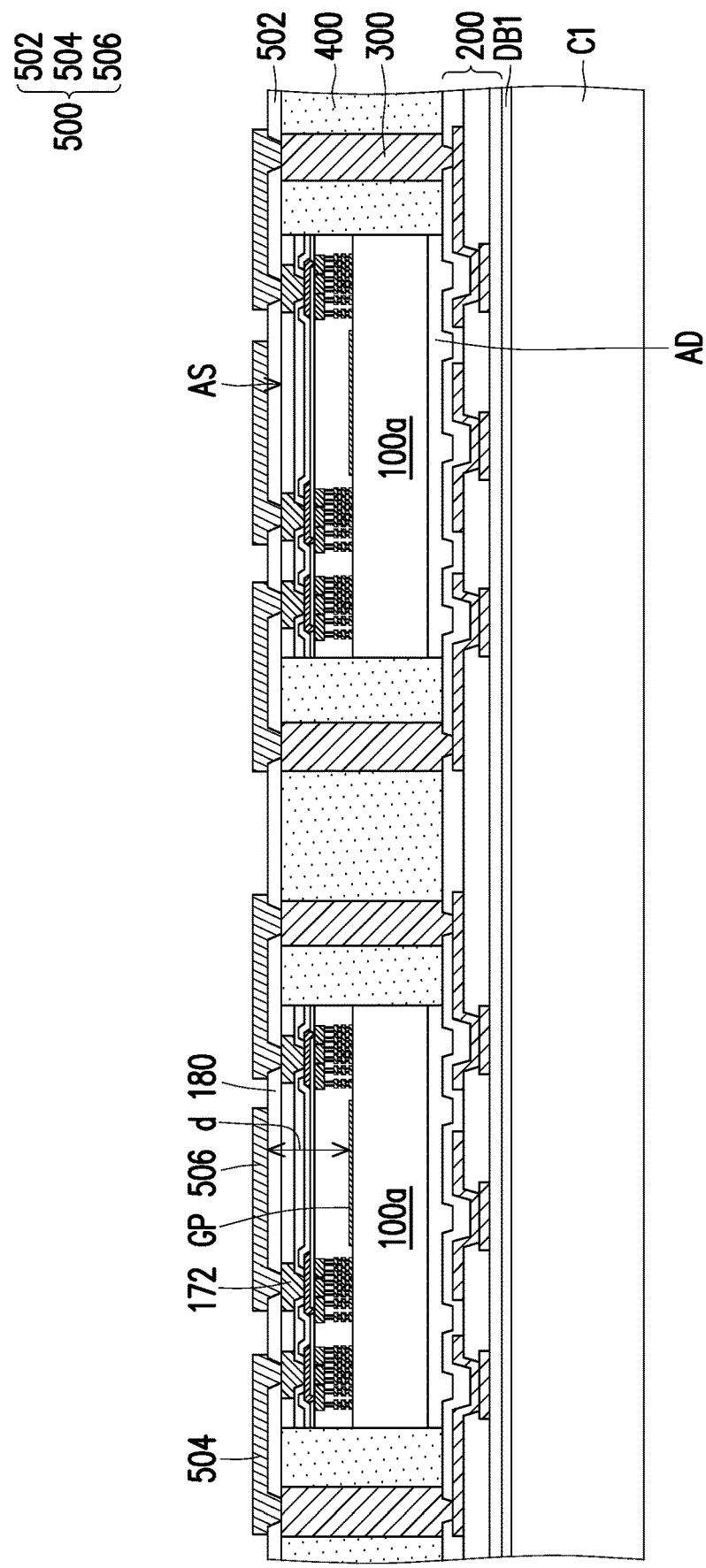

Referring to FIG. 1I, a redistribution structure 500 is formed on the dies 100a, the conductive structures 300, and the encapsulant 400. For example, the redistribution structure 500 is formed over the active surface AS of the dies 100a such that the redistribution structure 500 is opposite to the redistribution structure 200. In some embodiments, the redistribution structure 500 is electrically connected to the conductive posts 172 of the dies 100a and the conductive structures 300. It is noted that since the redistribution structure 500 is located on the active surface AS of the dies 100a, the redistribution structure 500 may be referred to as a "front-side redistribution structure" in some embodiments.

The redistribution structure 500 includes a dielectric layer 502, a plurality of routing patterns 504, and a plurality of antenna patterns 506. In some embodiments, the method of forming the redistribution structure 500 includes the following steps. First, the dielectric layer 502 is formed on the conductive structures 300, the dies 100a, and the encapsulant 400. In some embodiments, a material of the dielectric layer 502 includes polyimide, epoxy resin, acrylic resin, phenol resin, BCB, PBO, or any other suitable polymer-based dielectric material. The dielectric layer 502, for example, may be formed by suitable fabrication techniques such as spin-on coating, CVD, PECVD, or the like. Thereafter, a plurality of contact openings is formed in the dielectric layer 502. The contact openings at least partially expose each conductive post 172 and each conductive structure 300. Then, a seed material layer (not shown) is formed over the dielectric layer 502 and in the contact openings. The seed material layer extends into the contact openings to be in contact with the conductive posts 172 and the conductive structures 300. In some embodiments, the seed material layer includes a titanium/copper composite layer and is formed by a sputtering process. Then, a mask pattern (not shown) having openings is formed on the seed material layer. The openings of the mask pattern expose the intended location for the subsequently formed routing patterns 504 and antenna patterns 506. For example, the openings of the mask pattern may expose the seed material layer located inside of the contact openings and the seed material layer in proximity of the contact openings. Afterwards, a plating process is performed to form a conductive material layer on the seed material layer exposed by the openings of the mask pattern. In some embodiments, a material of the conductive material layer includes aluminum, titanium, copper, nickel, tungsten, and/or alloys thereof. The mask pattern and the underlying seed material layer are then removed by a stripping process and an etching process. The remaining seed material layer and the conductive material layer then constitute the routing patterns 504 and the antenna patterns 506. In other words, the antenna patterns 506 and the routing patterns 504 may be formed by a same photolithography and etching process at the same time.

In some embodiments, the routing patterns 504 are electrically connected to the dies 100a and the conductive structures 300. As such, signals originated from the dies 100a may be transmitted to the redistribution structure 200 sequentially through the routing patterns 504 and the conductive structures 300. On the other hand, the antenna patterns 506 are electrically connected to the dies 100a. For example, the antenna patterns 506 are electrically connected to the conductive posts 172 of the dies 100a. In some embodiments, since the antenna patterns 506 are located on the active side (active surface AS) of the dies 100a, the signal outputs from the dies 100a may be transmitted to the antenna patterns 506 with a short travelling distance. In other words, the signal may be considered as a "direct feed" signal. Owing to the short travelling distance, the signal loss during travelling may be effectively reduced and the antenna efficiency may be sufficiently enhanced. Moreover, since the antenna patterns 506 are located on the active side of the dies 100a, the overall thickness of the subsequently formed package structure may be sufficiently reduced. In some embodiments, the antenna patterns 506 are electrically coupled with the ground planes GP. It is noted that throughout the description, the term "electrically coupled with" is intended to describe transmission of energy from one element to another element through electromagnetic radiation. For example, when one element is electrically coupled with another element, these two elements may be physically isolated from each other, and the energy or signal transmission between these elements may be achieved through electromagnetic radiations. In some embodiments, the antenna patterns 506 and the corresponding ground planes GP are at least partially overlapped along a direction perpendicular to an extending direction of the active surface AS of the dies 100a to achieve coupling. For example, as illustrate in FIG. 1I, a vertical projection of the antenna patterns 506 onto dies 100a is overlapped with the ground planes GP.

In some embodiments, a distance d between the antenna patterns 506 and the ground planes GP ranges between 30 μm and 40 μm. Since the distance d between the ground planes GP and the antenna patterns 506 depends on the thickness of the interconnection structure 120a, the dielectric layer 130, the conductive pads 140, the passivation layer 150, the post-passivation layer 160, and the conductive posts 172, the distance d may be controllable based on the design of the interconnection structure 120a, the dielectric layer 130, the conductive pads 140, the passivation layer 150, the post-passivation layer 160, and the conductive posts 172. As such, various application with different antenna frequencies may be easily realized by adjusting the thicknesses of the interconnection structure 120a, the dielectric layer 130, the conductive pads 140, the passivation layer 150, the post-passivation layer 160, and the conductive posts 172.

Figure 1J:
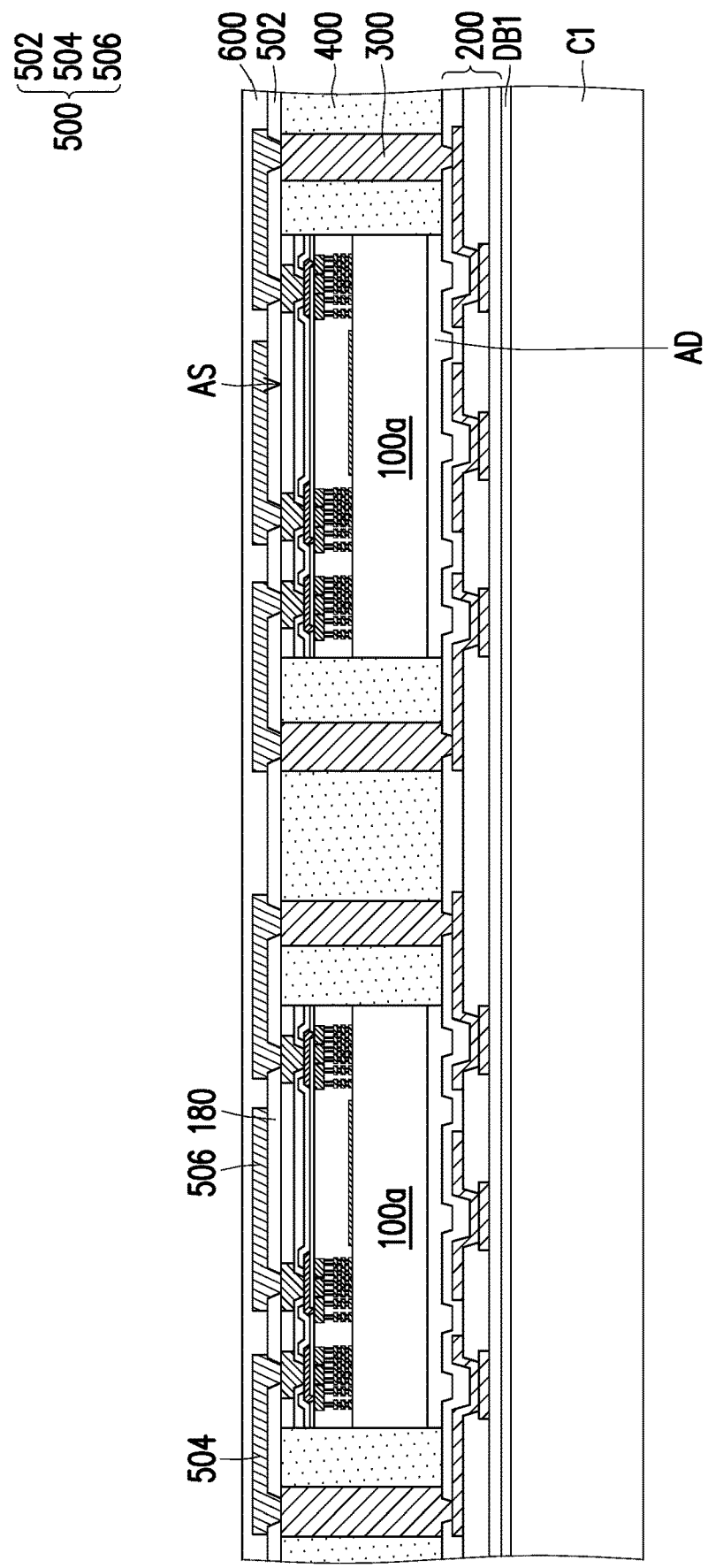

Referring to FIG. 1J, a cap layer 600 is formed on the redistribution structure 500 to cover the routing patterns 504 and the antenna patterns 506. In other words, the routing patterns 504 and the antenna patterns 506 are embedded in the cap layer 600. In some embodiments, the cap layer 600 may be selected from low Df and/or Dk materials to ensure the signal transmission quality. For example, the material of the cap layer 600 may include polymer, epoxy, the like, or a combination thereof. It is noted that the formation of the cap layer 600 is optional. That is, in some embodiments, the step illustrated in FIG. 1J may be skipped.

Figure 1K:
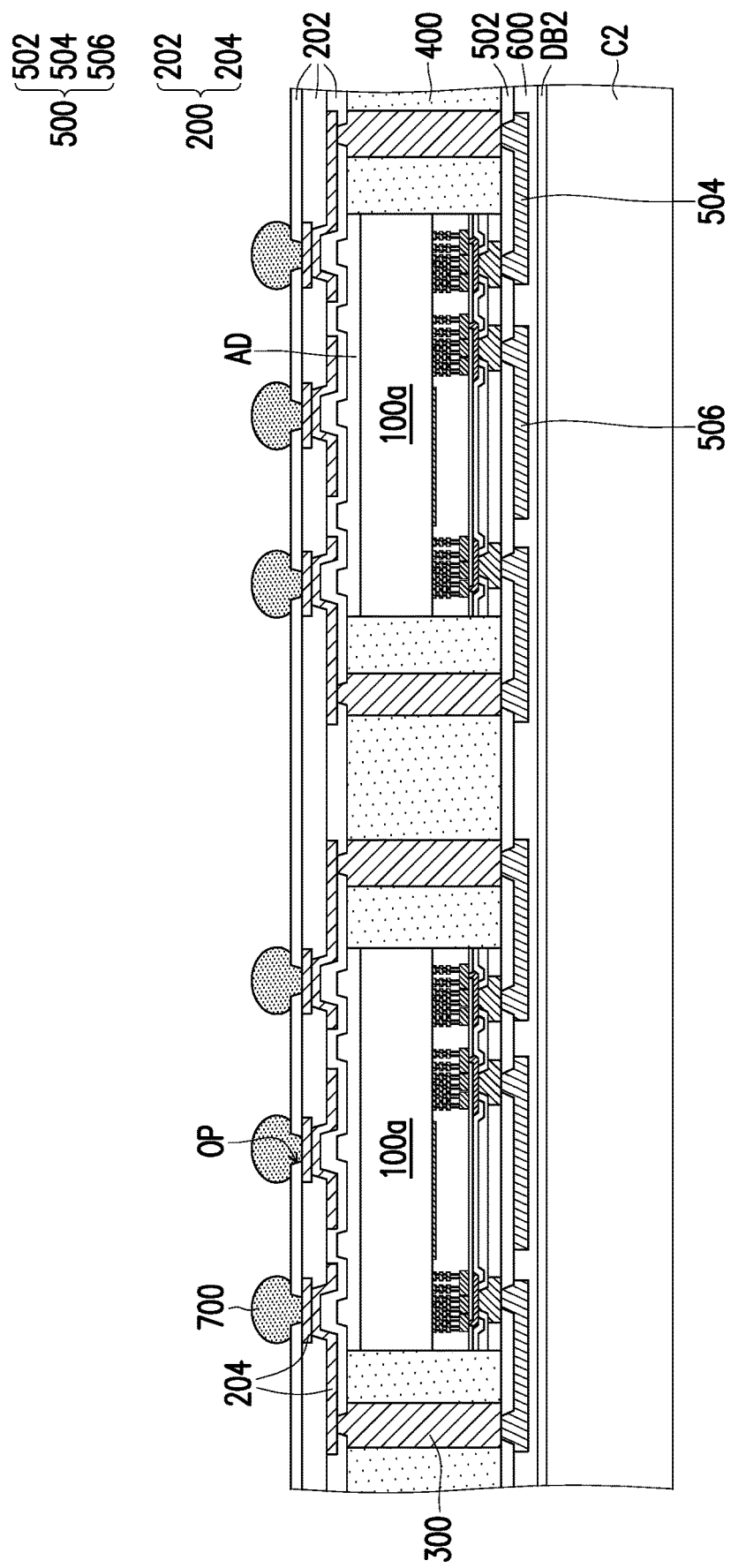

Referring to FIG. 1J and FIG. 1K, the structure illustrated in FIG. 1J is flipped upside down and is placed on a carrier C2 having a de-bonding layer DB2 formed thereon. The carrier C1 and the de-bonding layer DB2 may be respectively similar to the carrier C1 and the de-bonding layer DB1, so the detailed descriptions thereof are omitted herein. The de-bonding layer DB1 and the carrier C1 are removed from the redistribution structure 200. In some embodiments, the de-bonding layer DB1 (e.g., the LTHC release layer) may be irradiated by an UV laser such that the carrier C1 and the de-bonding layer DB1 may be peeled off from the dielectric layer 202 of the redistribution structure 200. However, the de-bonding process is not limited thereto. Other suitable de-carrier methods may be used in some alternative embodiments.

After the carrier C1 and the de-bonding layer DB1 are being removed to expose the redistribution structure 200, a plurality of openings OP is formed in the outermost dielectric layer 202 of the redistribution structure 200. In some embodiments, the openings OP are formed by a laser drilling process, a mechanical drilling process, a photolithography process and an etching process, or other suitable processes. In some embodiments, the openings OP expose the outermost redistribution circuit patterns 204 of the redistribution structure 200. After the openings OP are formed in the outermost dielectric layer 202, a plurality of conductive terminals 700 is formed over the redistribution structure 200 opposite to the dies 100a. In some embodiments, the conductive terminals 700 extend into the openings OP to electrically connect with the outermost redistribution circuit pattern 204. In some embodiments, a plurality of under bump metallization (UBM) patterns (not shown) may be formed on the outermost dielectric layer 202 and in the openings OP. The conductive terminals 700 may be disposed over the UBM patterns. In some embodiments, the conductive terminals 700 are attached to the UBM patterns through a solder flux. In some embodiments, the conductive terminals 700 are, for example, solder balls. In some embodiments, the conductive terminals 700 may be disposed on the redistribution structure 200 through a ball placement process and/or a reflowing process. In some embodiments, the conductive terminals 700 are formed to be a full ball grid array (BGA). As such, better thermal properties may be realized in the subsequently formed package structure.

Figure 1L:
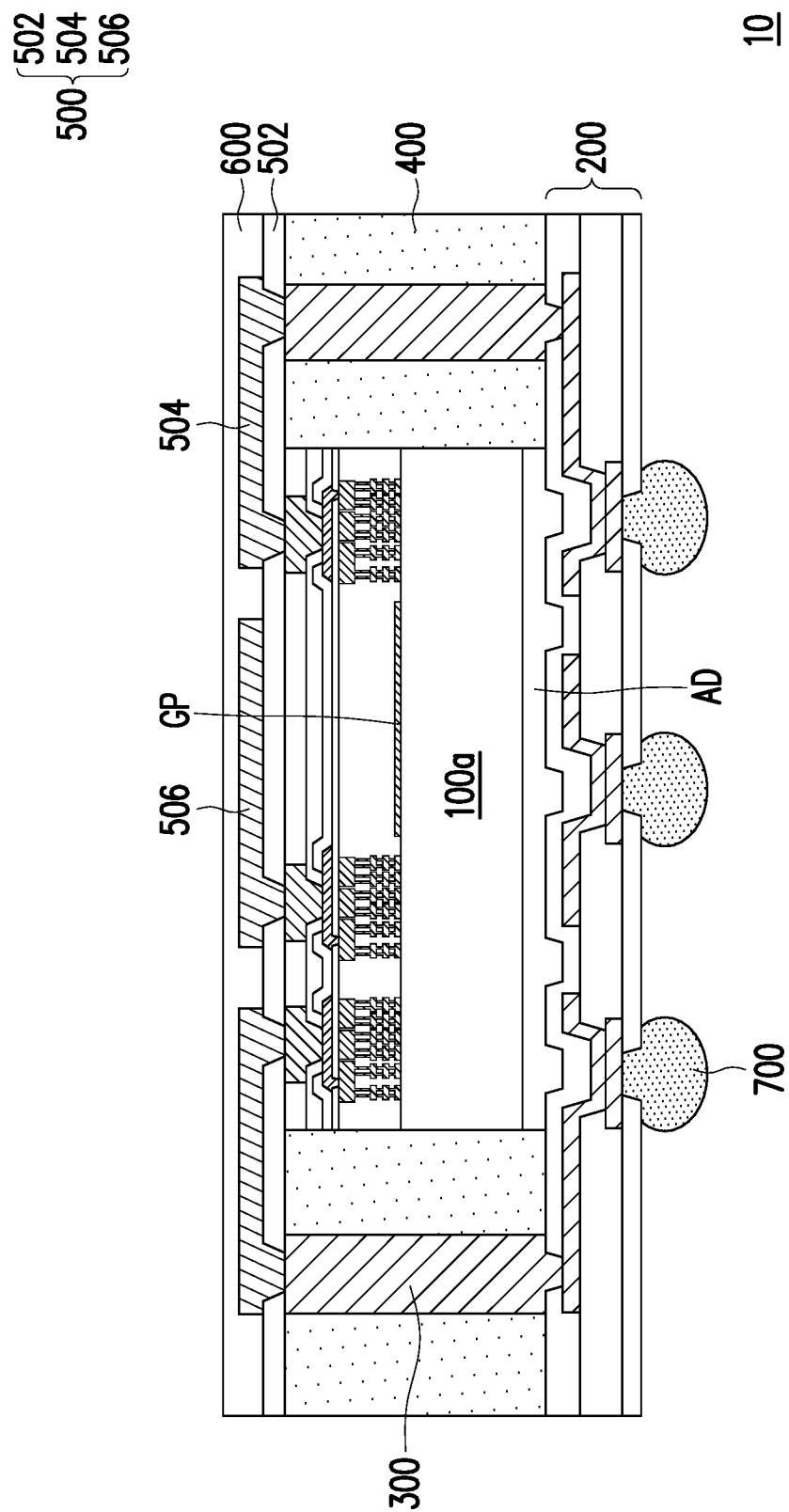

Referring to FIG. 1L, the structure illustrated in FIG. 1K is flipped upside down. The carrier C2 and the de-bonding layer DB2 are removed. The removal of the carrier C2 and the de-bonding layer DB2 may be similar to that of the carrier C1 and the de-bonding layer DB1, so the detailed descriptions thereof are omitted herein. At this stage, the manufacturing process of the package structure 10 is substantially completed. In some embodiments, the package 10 may be referred to as an integrated fan-out (InFO) package. However, the disclosure is not limited thereto. In some alternative embodiments, the package 10 may be other types of packages.

Figure 2C:
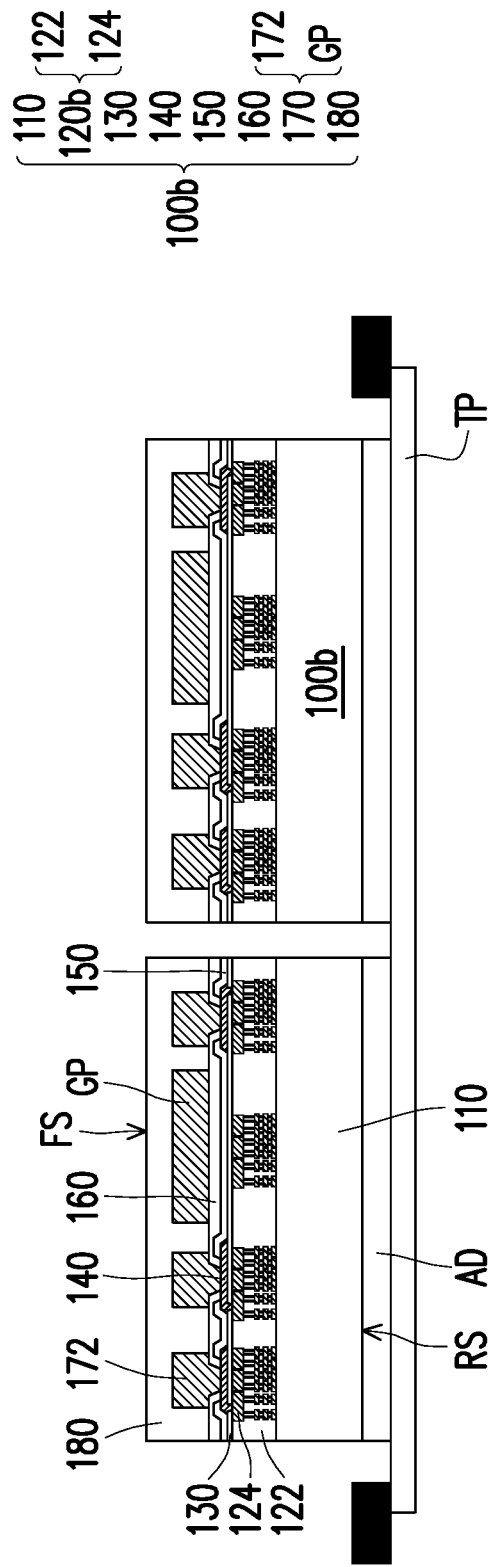

FIG. 2A to FIG. 2L are schematic cross-sectional views illustrating a manufacturing process of a package structure 20 in accordance with some alternative embodiments of the disclosure. The elements presented in FIG. 2A to FIG. 2L similar to the elements shown in FIG. 1A to FIG. 1L may be denoted by the same reference numeral as labelled in FIG. 1A to FIG. 1L. Referring to FIG. 2A, the step illustrated in FIG. 2A is similar to the steps illustrated in FIG. 1A to FIG. 1B, so the detailed descriptions thereof are omitted herein. The difference between the step illustrated in FIG. 2A and the steps illustrated in FIG. 1A to FIG. 1B lies in the omission of forming a ground plane in the interconnection structure 120b. For example, the interconnection structure 120b includes an inter-dielectric layer 122 and a plurality of patterned conductive layers 124 and does not include a ground plane.

Referring to FIG. 2B, a conductive layer 170 is formed over the conductive pads 140 and the post-passivation layer 160. In some embodiments, the conductive layer 170 includes a plurality of conductive posts 172 and a plurality of ground planes GP. In some embodiments, the conductive posts 172 are formed to stand on the conductive pads 140 while the ground planes GP are formed to stand on the post-passivation layer 160. In some embodiments, the conductive layer 170 may be formed by the following steps. First, a seed layer (not shown) may be sputtered onto the post-passivation layer 160 and the revealed portion of the conductive pads 140. In some embodiments, the seed layer includes titanium, copper, or a combination thereof. A patterned mask layer (not shown) may be then formed over the seed layer by photolithography. The patterned mask layer reveals portions of the seed layer that correspond to predetermined positions of the subsequently formed conductive layer 170. The semiconductor wafer 110' including the patterned mask layer formed thereon may be immersed into a plating solution in a plating bath such that a conductive material (not shown) is plated on the portions of the seed layer revealed by the patterned mask layer. In some embodiments, the conductive material includes, for example, aluminum, titanium, copper, nickel, tungsten, and/or alloys thereof. After forming the conductive material, the patterned mask layer is stripped. Thereafter, by using the conductive material as a hard mask, portions of the seed layer that are not covered by the conductive material may be removed through etching until the post-passivation layer 160 is revealed. The conductive material and the remaining seed layer then forms the conductive layer 170. Since the conductive layer 170 includes the conductive posts 172 and the ground planes GP, the conductive posts 172 and the ground planes GP are simultaneously formed. For example, the conductive posts 172 and the ground planes GP may be formed by a same photolithography and etching process at the same time. As such, the ground planes GP and the conductive posts 172 are located at a same level and are considered as a same layer. In some embodiments, the ground planes GP are electrically insulated from the conductive posts 172. In some embodiments, the ground planes GP are electrically connected to a ground.

After the conductive posts 172 and the ground planes GP are formed, a protection layer 180 is formed over the post-passivation layer to encapsulate the conductive posts 172 and the ground planes GP. The material and the formation method of the protection layer 180 in FIG. 2B may be similar to that of the protection layer 180 in FIG. 1C, so the detailed description thereof is omitted herein.

Referring to FIG. 2C, the step illustrated in FIG. 2C is similar to the step illustrated in FIG. 1D, so the detailed description thereof is omitted herein. Referring to FIG. 2C, upon singulating the structure illustrated in FIG. 2B, a plurality of dies 100b is obtained. In some embodiments, each die 100b includes the semiconductor substrate 110, the interconnection structure 120b, the dielectric layer 130, the conductive pads 140, the passivation layer 150, the post-passivation layer 160, the conductive layer 170, and the protection layer 180. The interconnection structure 120b, the dielectric layer 130, and the conductive pads 140 are sequentially formed over the semiconductor substrate 110. The conductive layer 170 is formed on the conductive pads 140 and the post-passivation layer 160. The protection layer 180 is formed to encapsulate the conductive layer 170. In some embodiments, the conductive layer 170 includes the conductive posts 172 and the ground planes GP. That is, the ground planes GP are within the die 100b and are over the conductive pads 140.

Figure 2D:
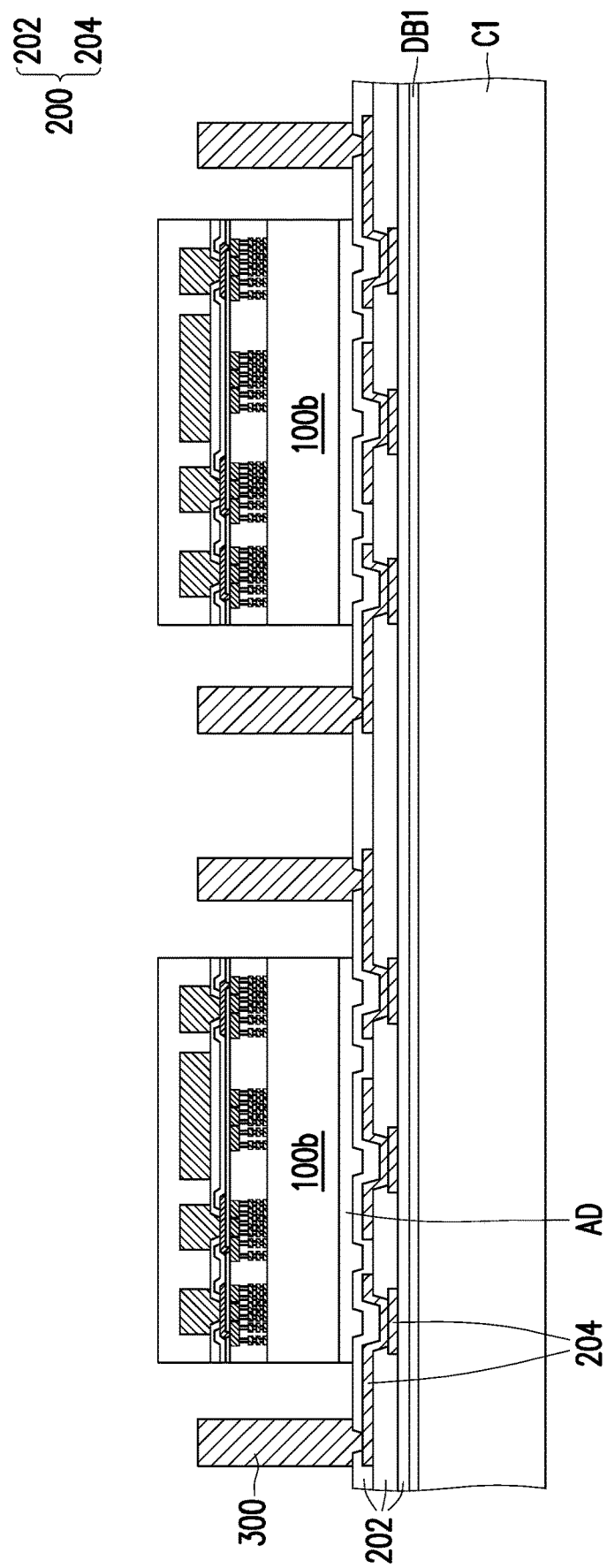
Figure 2E:
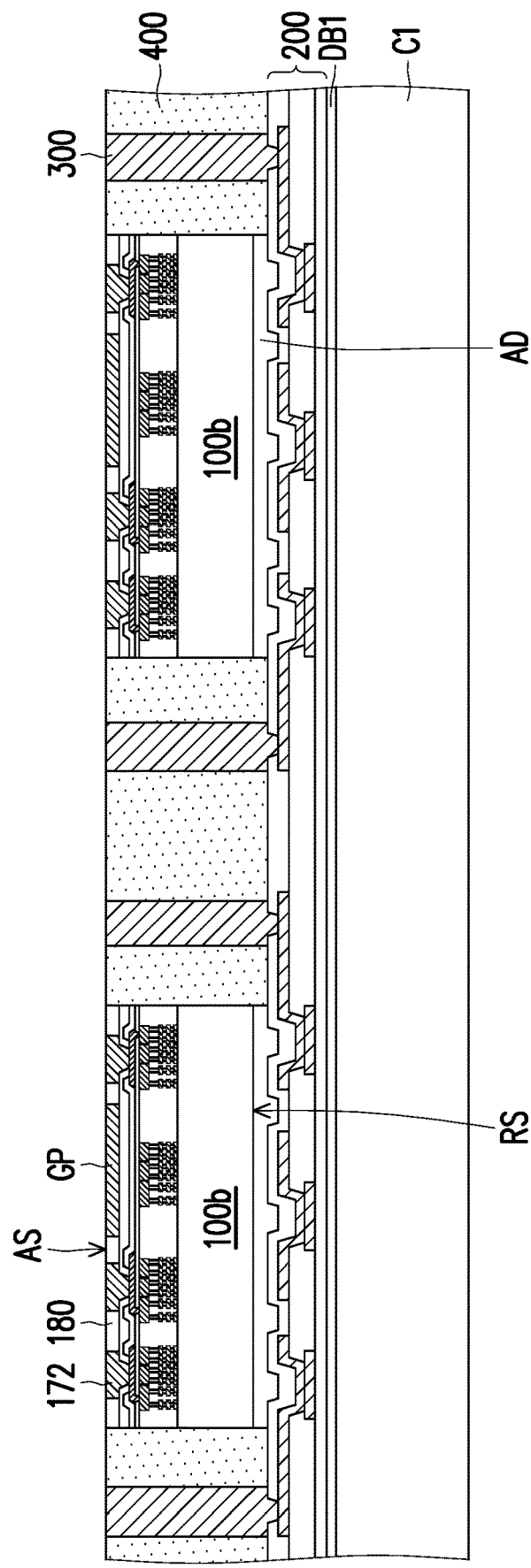

Referring to FIG. 2D and FIG. 2E, the steps illustrated in FIG. 2D and FIG. 2E are similar to the steps illustrated in FIG. 1E to FIG. 1H, so the detailed descriptions thereof are omitted herein. As illustrated in FIG. 2E, each die 100b has an active surface AS opposite to the rear surface RS. The exposed portion of the conductive posts 172 and the exposed portion of the ground planes GP are located on the active surface AS of the dies 100b. In some embodiments, top surfaces of the conductive structures 300, top surfaces of the conductive posts 172, top surfaces of the ground planes GP, and a top surface of the protection layer 180 are substantially coplanar with a top surface of the encapsulant 400.

Figure 2F:
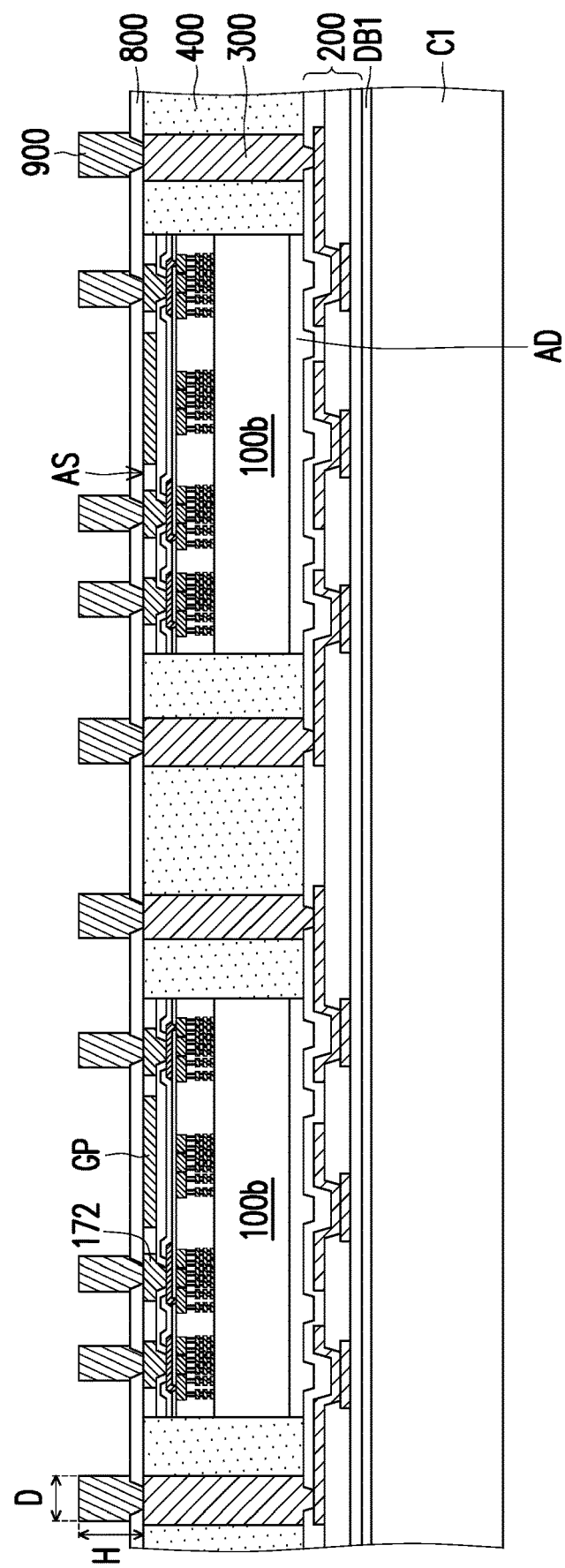

Referring to FIG. 2F, a dielectric layer 800 and a plurality of through insulating vias 900 are sequentially formed over the active surfaces AS of the dies 100b, the conductive structures 300, and the encapsulant 400. In some embodiments, a material of the dielectric layer 800 includes polyimide, epoxy resin, acrylic resin, phenol resin, BCB, PBO, or any other suitable polymer-based dielectric material. The dielectric layer 800, for example, may be formed by suitable fabrication techniques such as spin-on coating, CVD, PECVD, or the like. The dielectric layer 800 has a plurality of contact openings partially exposes each conductive post 172 and each conductive structure 300. In some embodiments, the through insulating vias 900 extend into the contact openings of the dielectric layer 800 to render electrical connection with the conductive posts 172 and the conductive structures 300. In some embodiments, a material of the through insulating vias 900 includes aluminum, titanium, copper, nickel, tungsten, and/or alloys thereof. The through insulating vias 900 may be formed by, for example, electroplating, deposition, and/or photolithography and etching. In some embodiments, a height H of the through insulating vias 900 ranges between 5 μm and 100 μm. In some embodiments, the height H of the through insulating vias 900 is greater than 30 μm. On the other hand, a diameter D of each through insulating via 900 ranges between 5 μm and 200 μm.

Figure 2G:
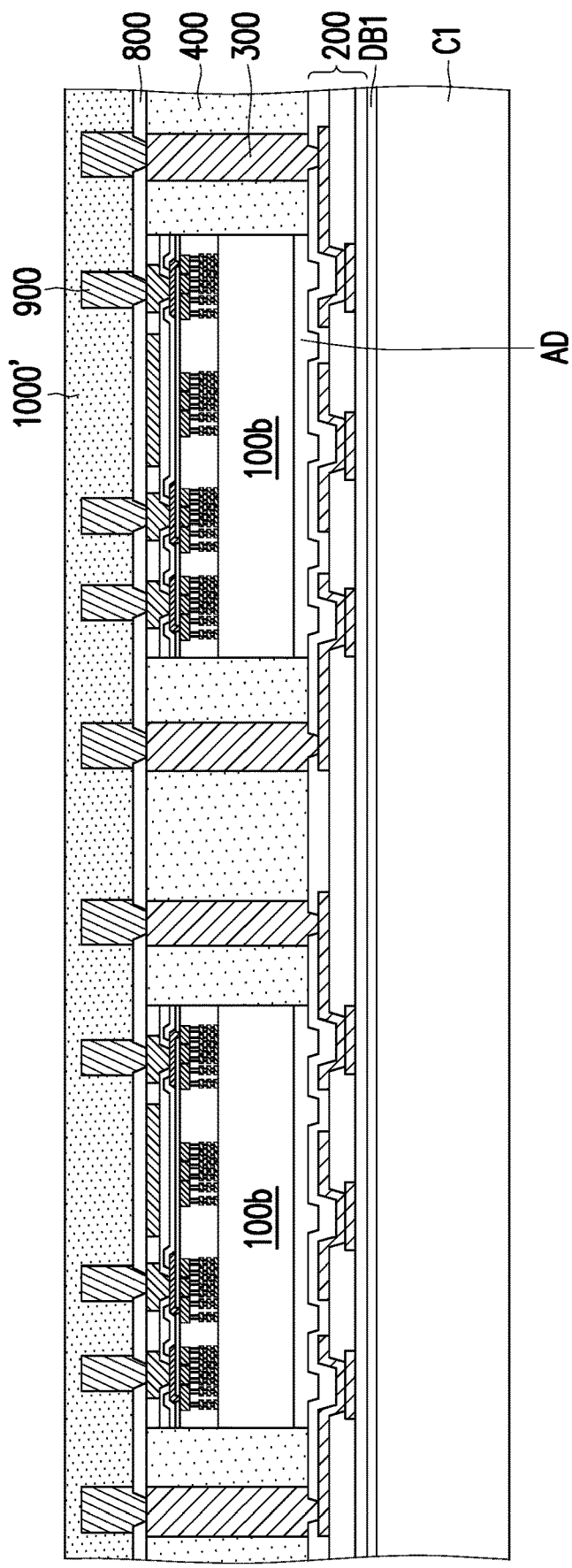

Referring to FIG. 2G, an insulating material 1000' is formed over the dielectric layer 800 to encapsulate the through insulating vias 900. In other words, the through insulating vias 900 are not revealed and are well protected by the insulating material 1000'. In some embodiments, the insulating material 1000' may be selected from low Df and/or Dk materials to ensure the signal transmission quality. For example, the insulating material 1000' may include polymer, epoxy, the like, or a combination thereof.

Figure 2H:
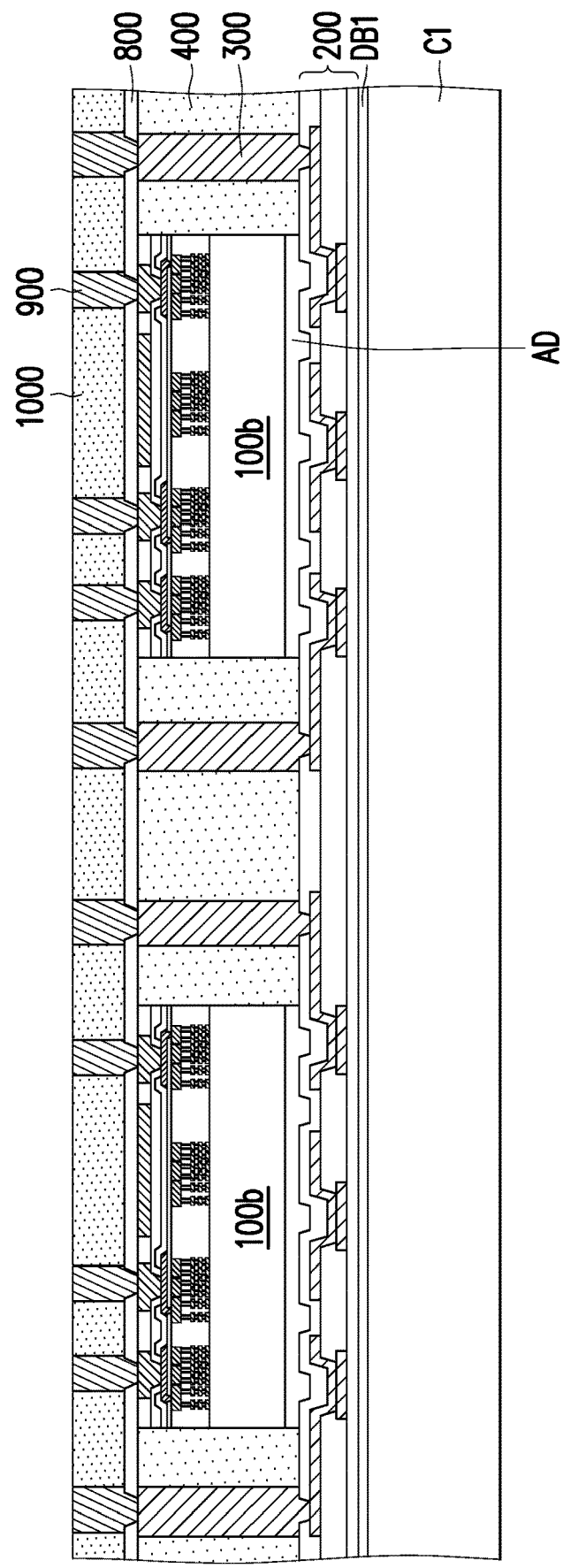
Figure 21:
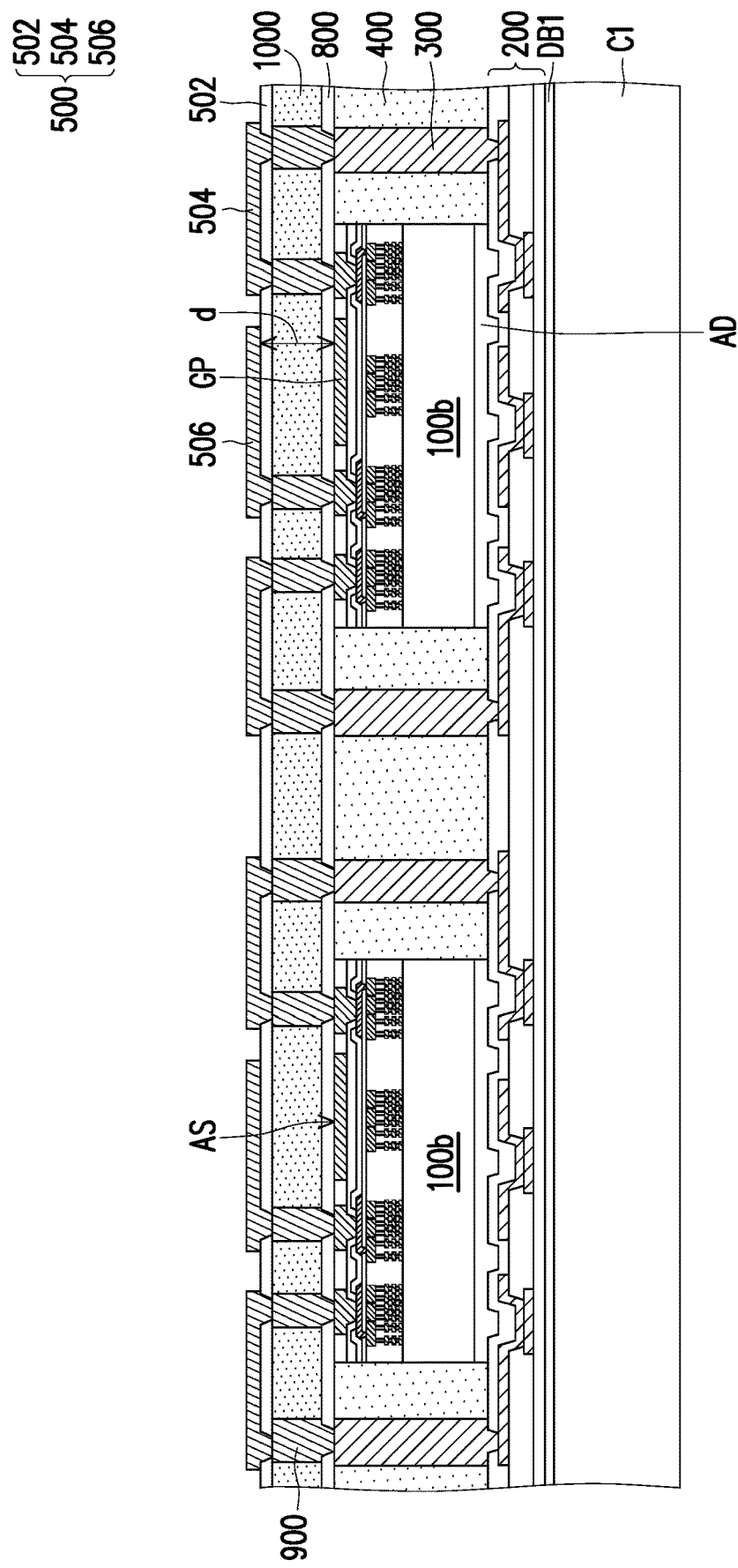

Referring to FIG. 2G and FIG. 2H, a portion of the insulating material 1000' is removed. For example, the insulating material 1000' is grinded until top surfaces of the through insulating vias 900 are exposed. After the insulating material 1000' is grinded, an insulating layer 1000 is formed over the dielectric layer 800 to encapsulate the through insulating vias 900. In some embodiments, the insulating material 1000' is grinded by a mechanical grinding process and/or a chemical mechanical polishing (CMP) process. In some embodiments, during the grinding process of the insulating material 1000', portions of the through insulating vias 900 are slightly grinded as well. In some embodiments, the insulating layer 1000 laterally encapsulates sidewalls of the through insulating vias 900. In other words, the through insulating vias 900 are embedded in the insulating layer 1000. For example, the through insulating vias 900 penetrate through the insulating layer 1000. In some embodiments, top surfaces of the through insulating vias 900 are substantially coplanar with a top surface of the insulating layer 1000.

Referring to FIG. 2I, a redistribution structure 500 is formed over the through insulating vias 900 and the insulating layer 1000. The material and the formation method of the redistribution structure 500 in FIG. 2I is similar to the redistribution structure 500 in FIG. 1I, so the detailed description thereof is omitted herein. As illustrated in FIG. 2I, the insulating layer 1000 is located between the redistribution structure 500 and the dies 100b. The redistribution structure 500 includes a dielectric layer 502, a plurality of routing patterns 504, and a plurality of antenna patterns 506. In some embodiments, the routing patterns 504 are electrically connected to the dies 100b and the conductive structures 300 through the through insulating vias 900. As such, signals originated from the dies 100b may be transmitted to the redistribution structure 200 sequentially through the through insulating vias 900, the routing patterns 504, and the conductive structures 300. On the other hand, the antenna patterns 506 are electrically connected to the die 100b through the through insulating vias 900. In some embodiments, since the antenna patterns 506 are located on the active side (active surface AS) of the dies 100b, the signal outputs from the dies 100b may be transmitted to the antenna patterns 506 with a short travelling distance. In other words, the signal may be considered as a "direct feed" signal. For example, the signal outputs from the dies 100b may be transmitted to the antenna patterns 506 through the through insulating vias 900. That is, in some embodiments, the through insulating vias 900 may be referred to as a feed line. Owing to the short travelling distance, the signal loss during travelling may be effectively reduced and the antenna efficiency may be sufficiently enhanced. Moreover, since the antenna patterns 506 are located on the active side of the dies 100b, the overall thickness of the subsequently formed package structure may be sufficiently reduced. In some embodiments, the antenna patterns 506 are electrically coupled with the ground planes GP. In some embodiments, the antenna patterns 506 and the corresponding ground planes GP are at least partially overlapped along a direction perpendicular to an extending direction of the active surface AS of the dies 100b to achieve coupling. For example, as illustrate in FIG. 2I, a vertical projection of the antenna patterns 506 onto the dies 100b is overlapped with the ground planes GP.

In some embodiments, a distance d between the antenna patterns 506 and the ground planes GP ranges between 3 μm and 50 μm. Since the distance d between the ground planes GP and the antenna patterns 506 depends on the thickness of the dielectric layer 800 and the through insulating vias 900, the distance d may be controllable based on the design of the dielectric layer 800 and the through insulating vias 900. As such, various application with different antenna frequencies may be easily realized by adjusting the thicknesses of the dielectric layer 800 and the through insulating vias 900.

Figure 2J:
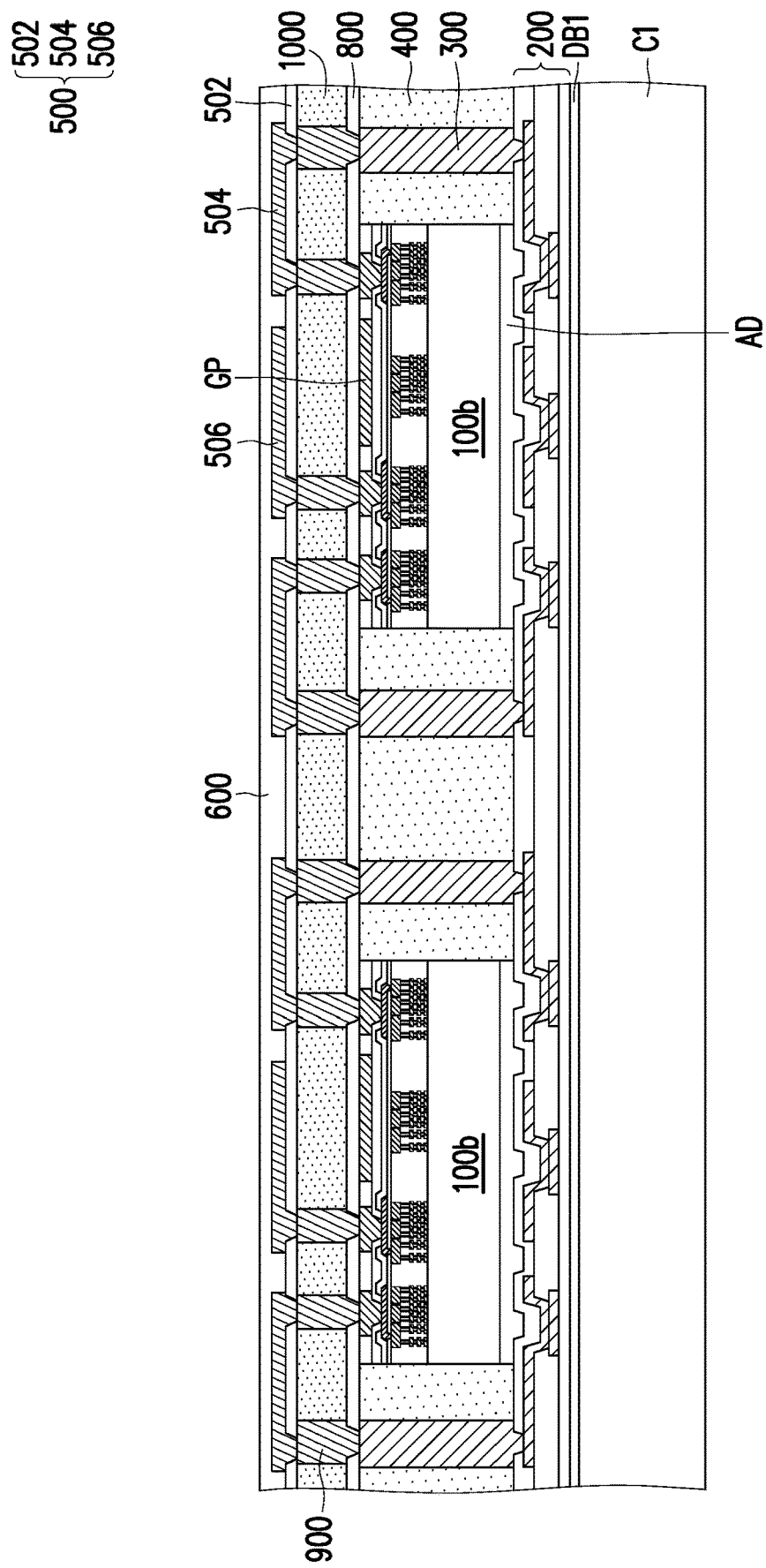
Figure 2K:
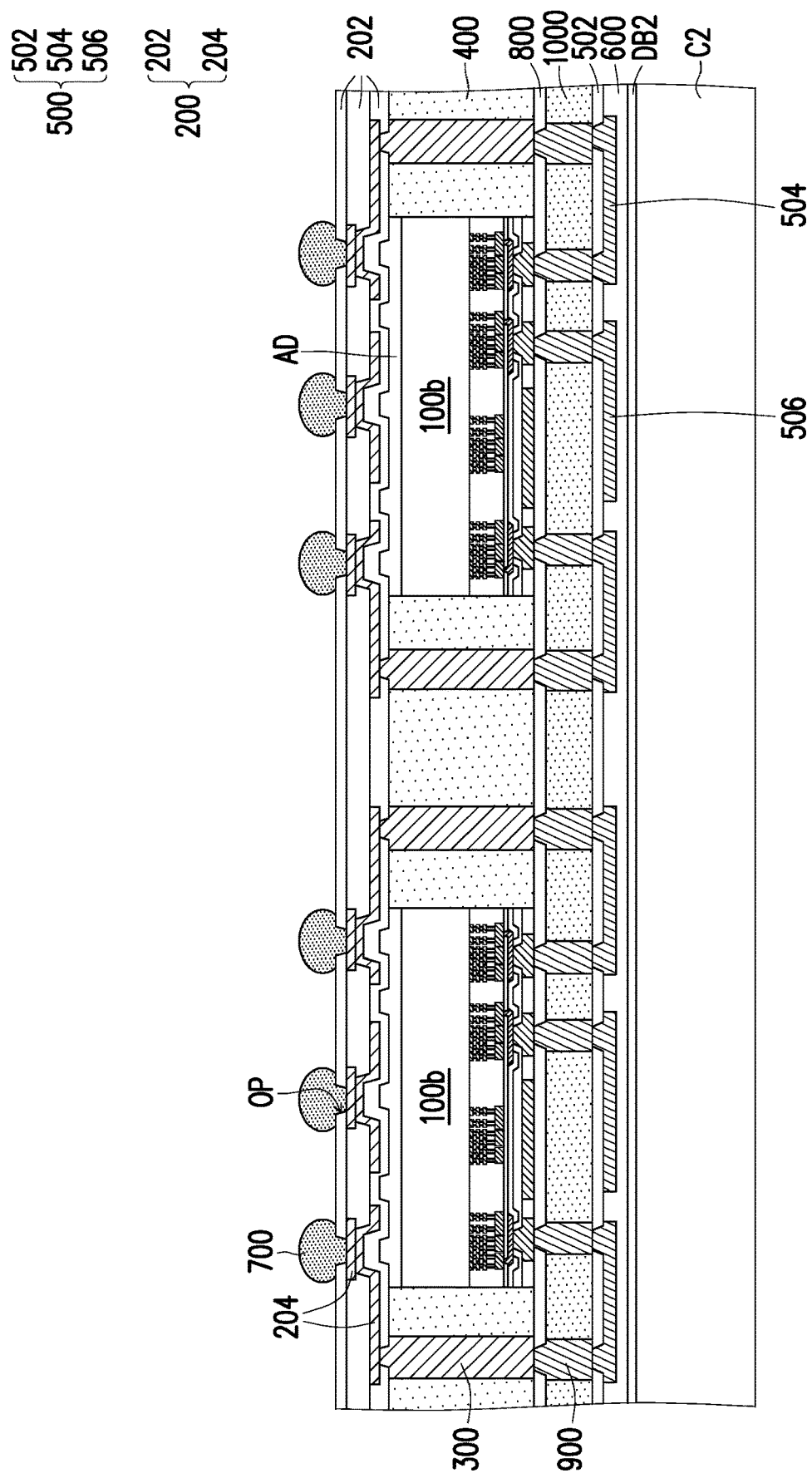
Figure 2L:
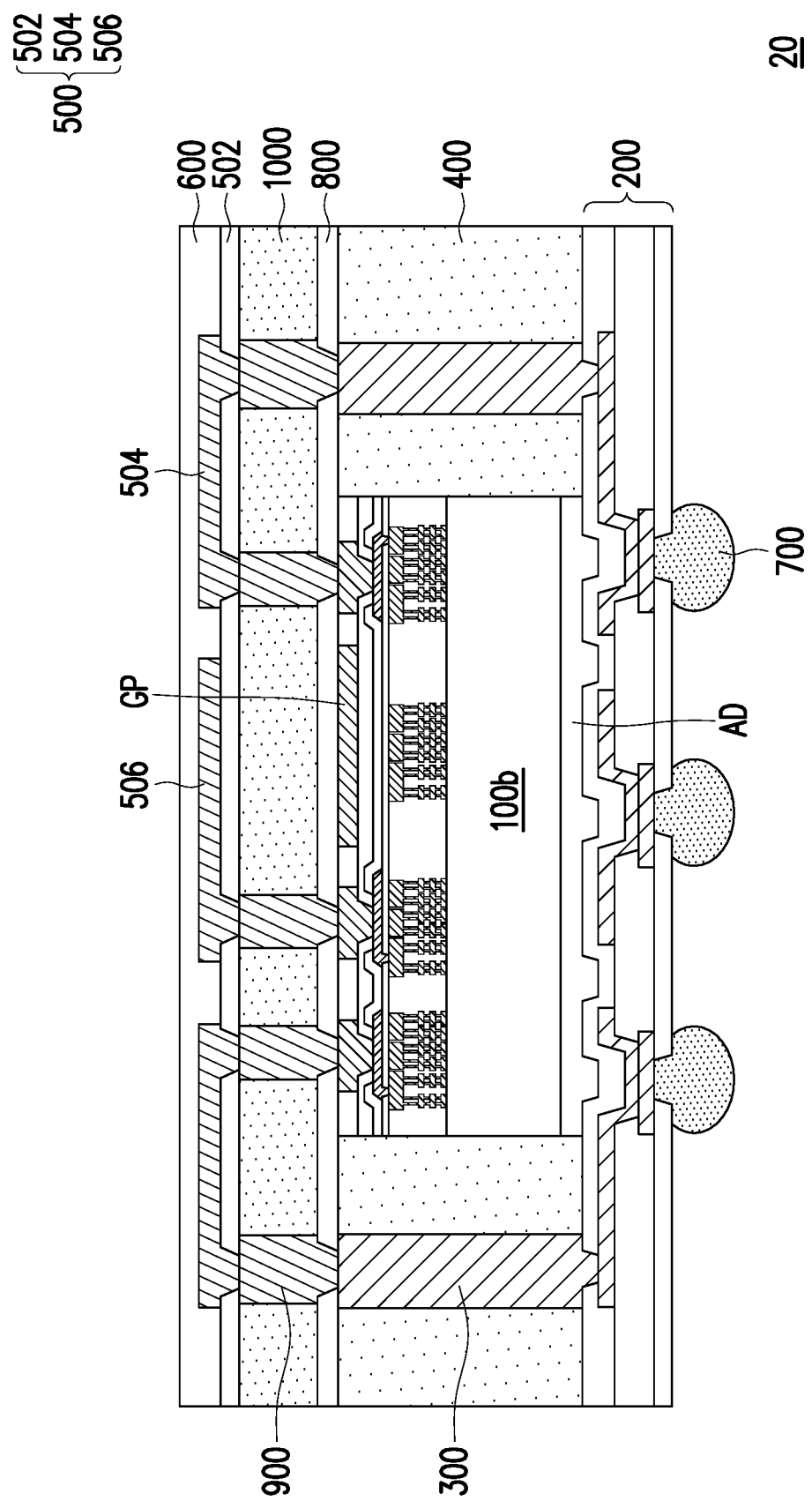

Referring to FIG. 2J to FIG. 2L, the steps illustrated in FIG. 2J to FIG. 2L are similar to the steps illustrated in FIG.

1J to FIG. 1L, so the detailed descriptions thereof are omitted herein. Referring to FIG. 2L, a package structure 20 is obtained. In some embodiments, the package 20 may be referred to as an InFO package. However, the disclosure is not limited thereto. In some alternative embodiments, the package 20 may be other types of packages.

Figure 3A:
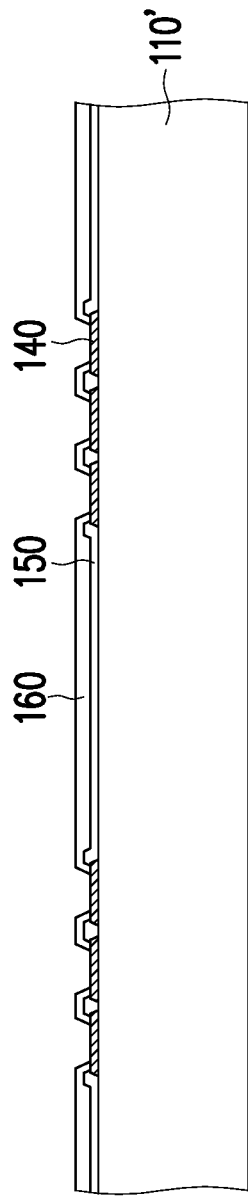
FIG. 3A to FIG. 3P are schematic cross-sectional views illustrating a manufacturing process of a package structure in accordance with some alternative embodiments of the disclosure.
Figure 3B:
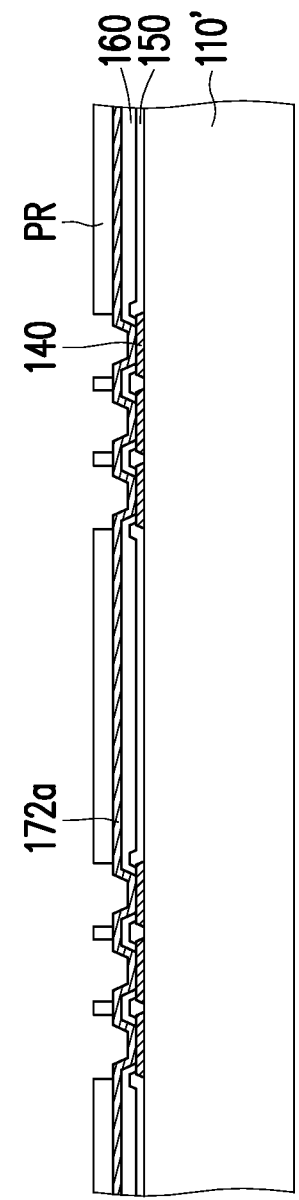
Figure 3C:
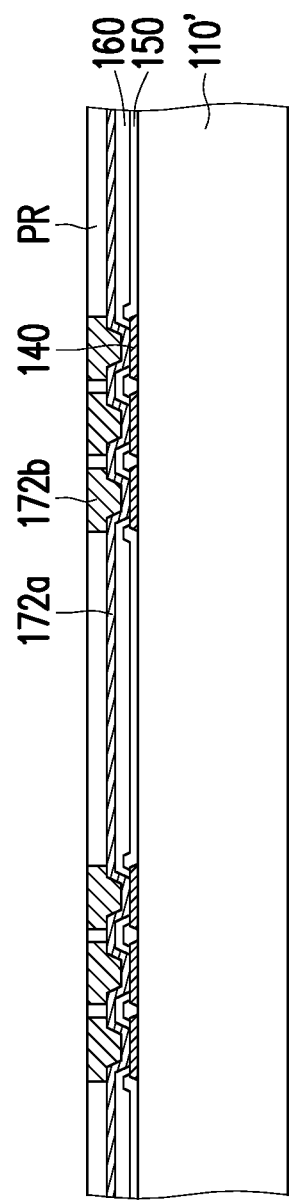
Figure 3D:
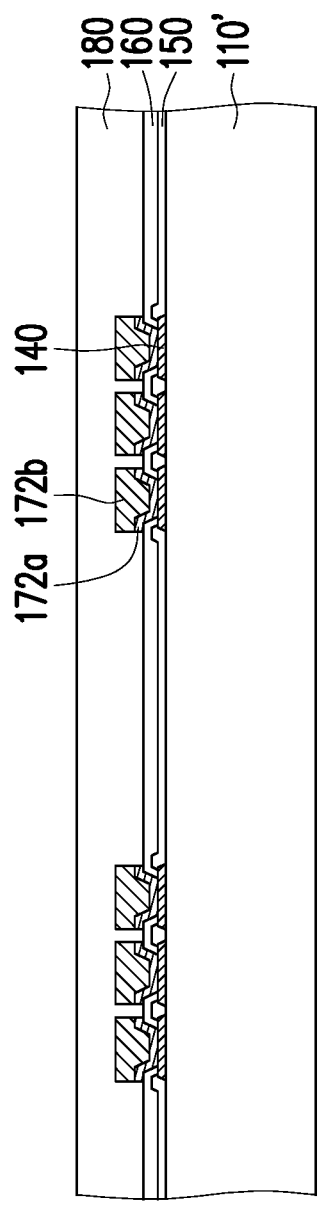
Figure 3E:
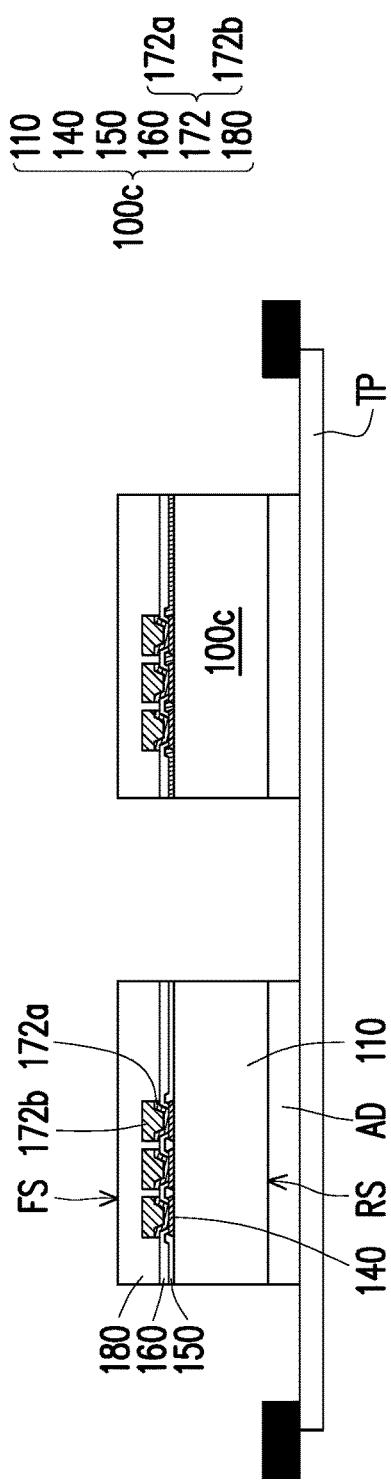
Figure 3F:
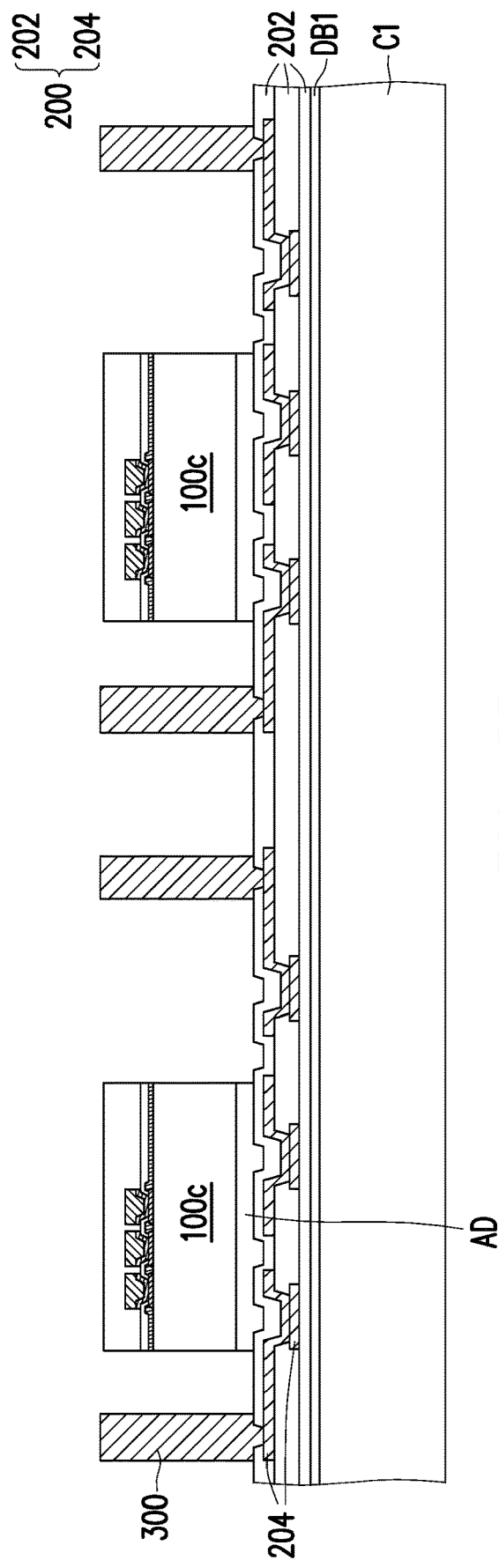
Figure 3G:
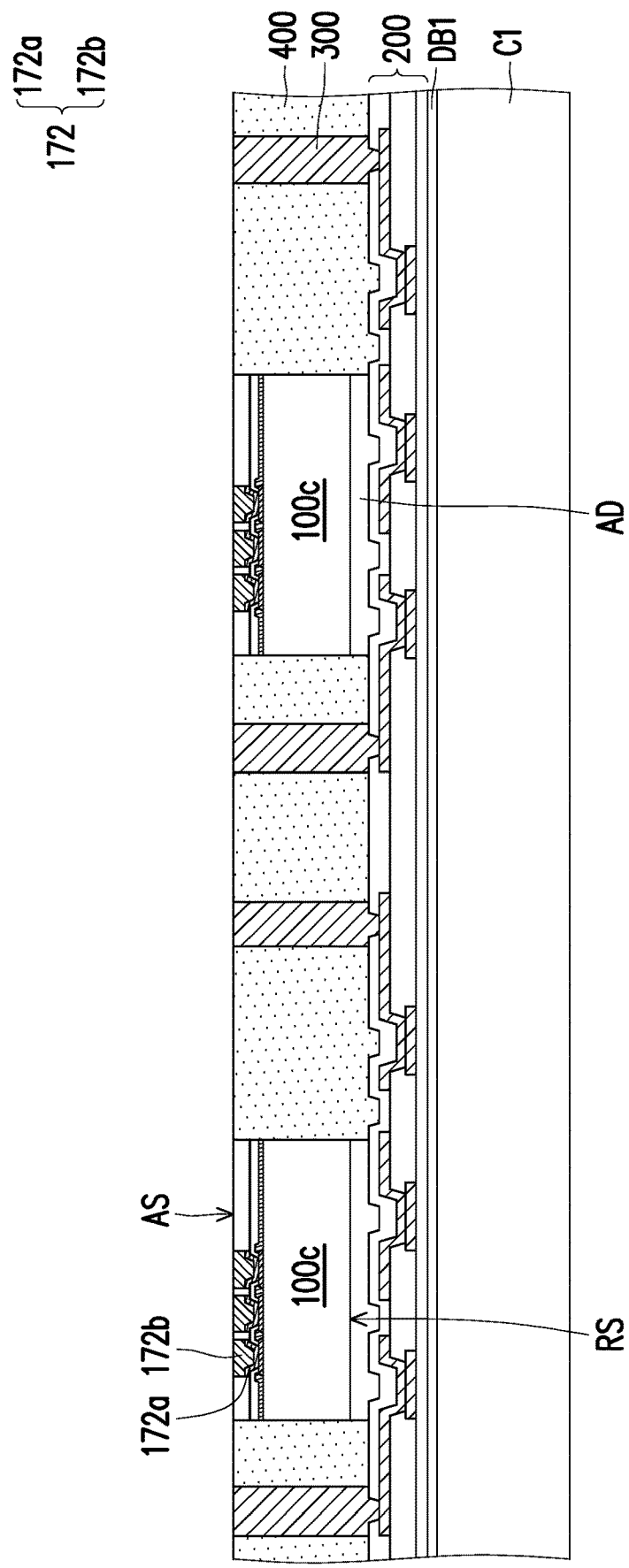
Figure 3H:
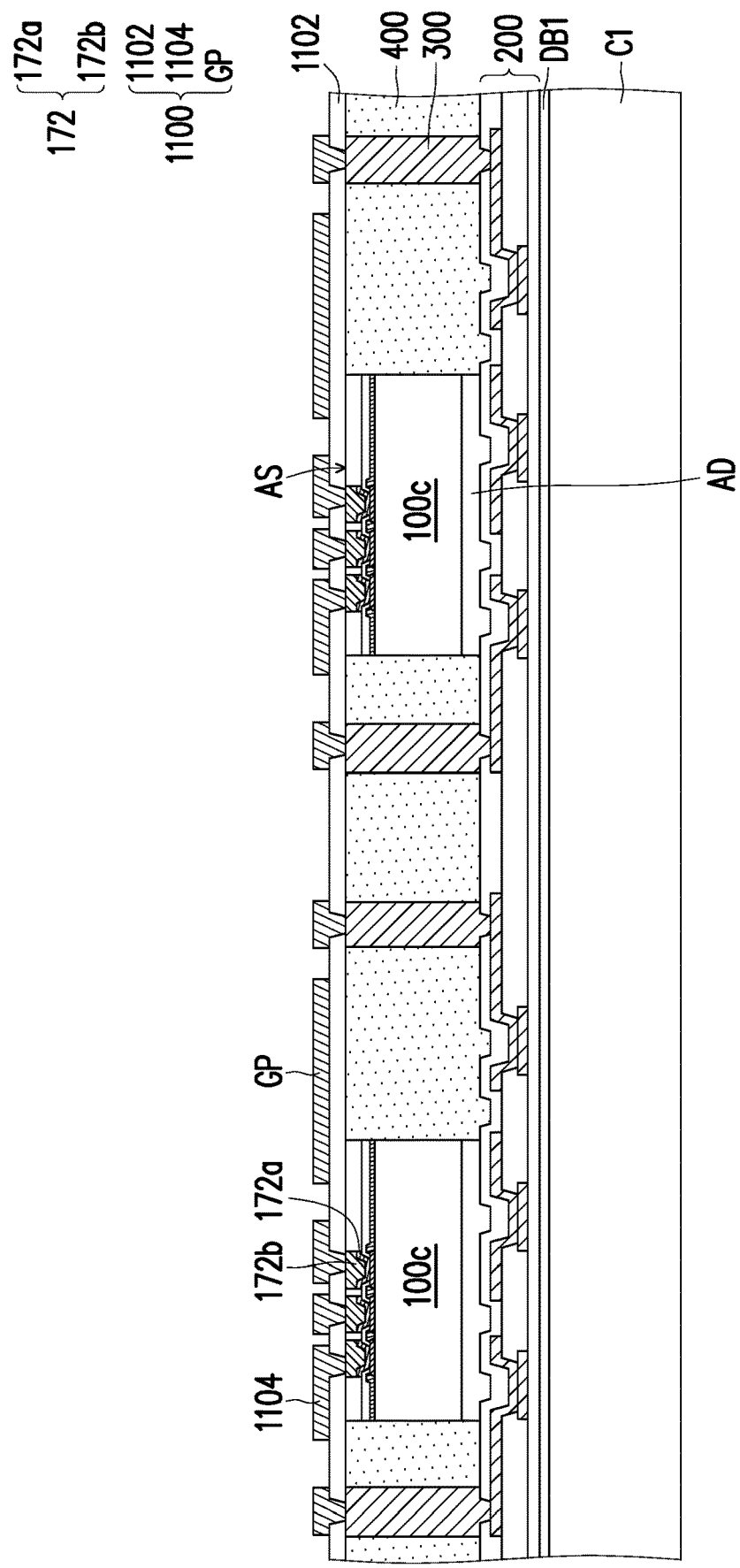
Figure 3I:
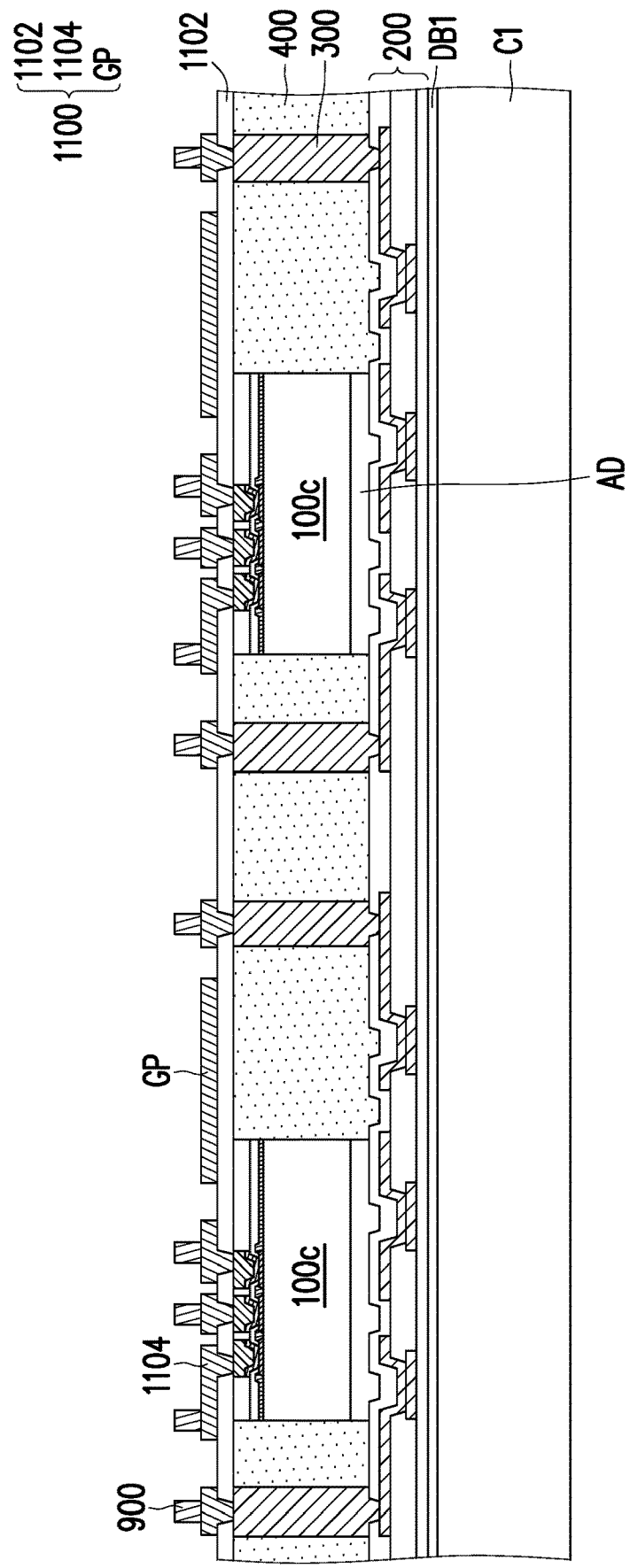
Figure 3J:
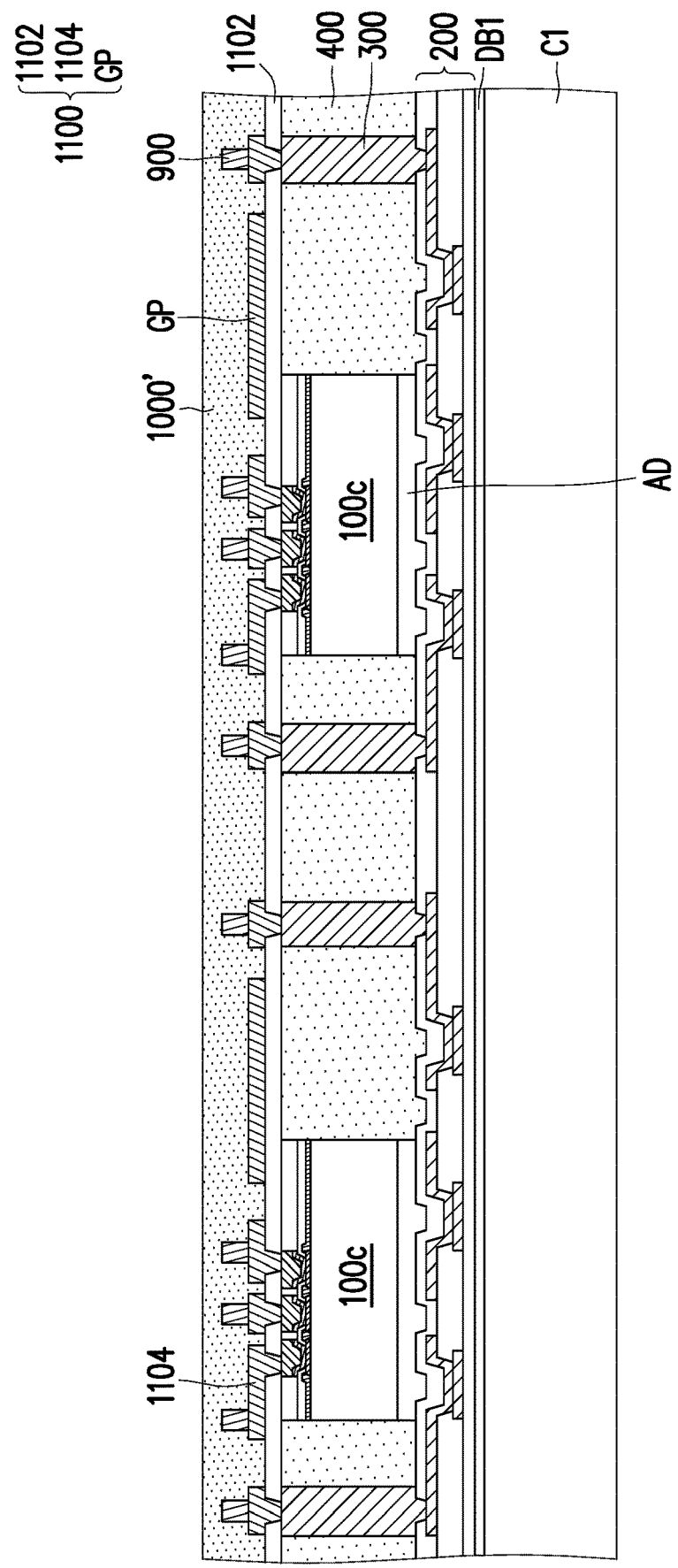
Figure 3K:
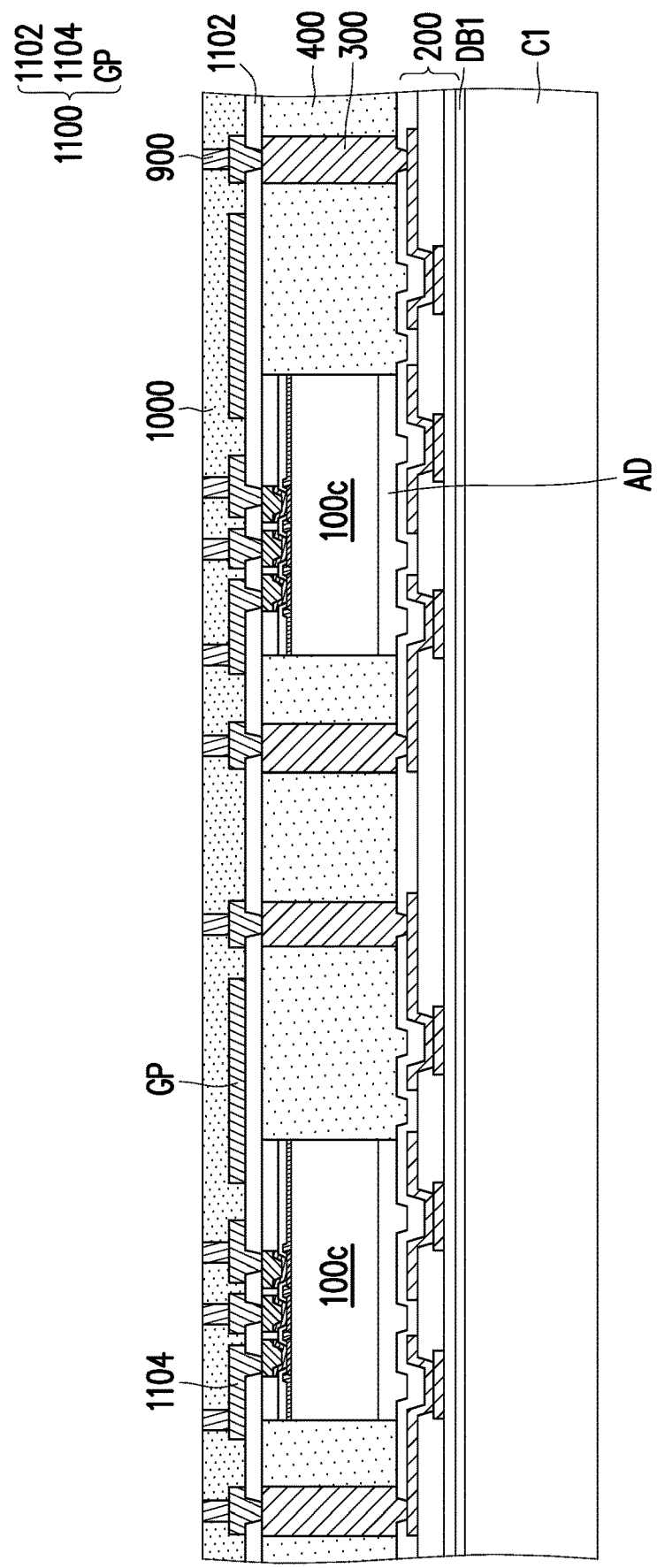
Figure 3L:
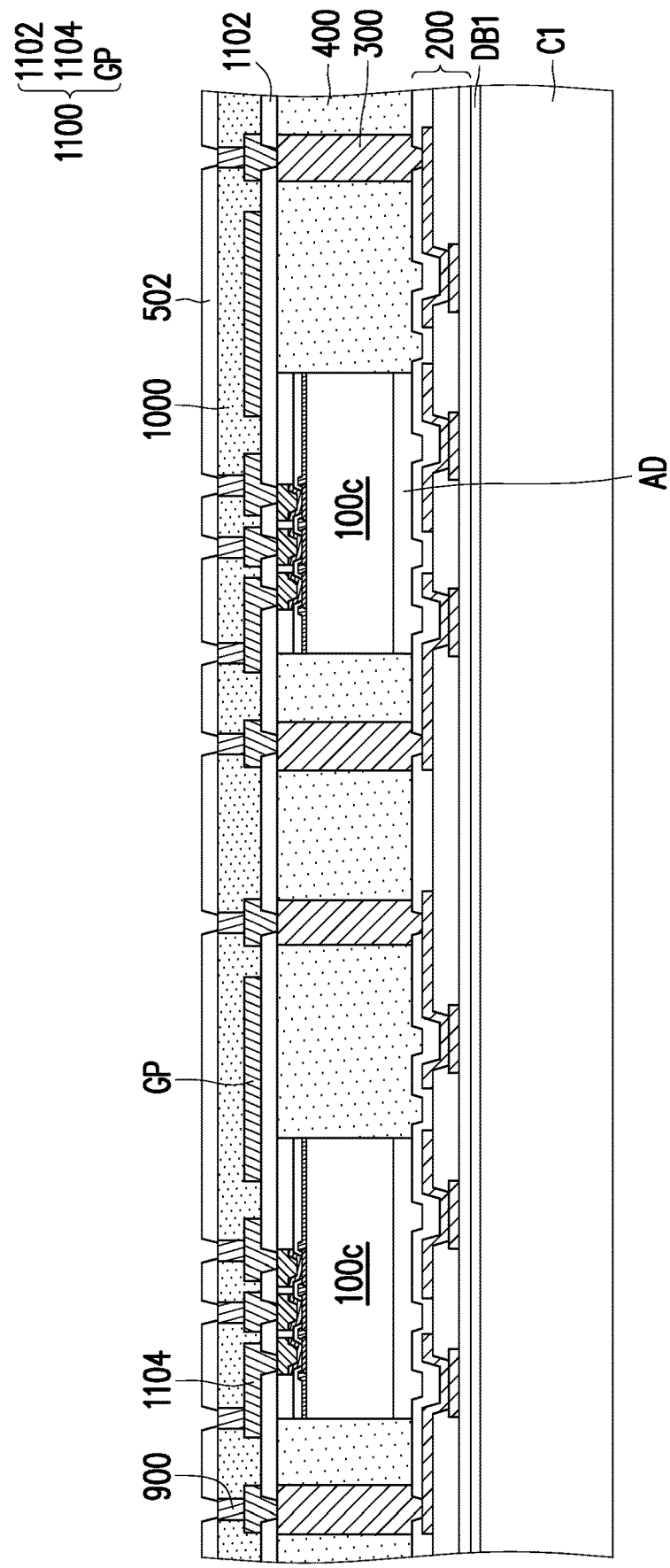
Figure 3M:
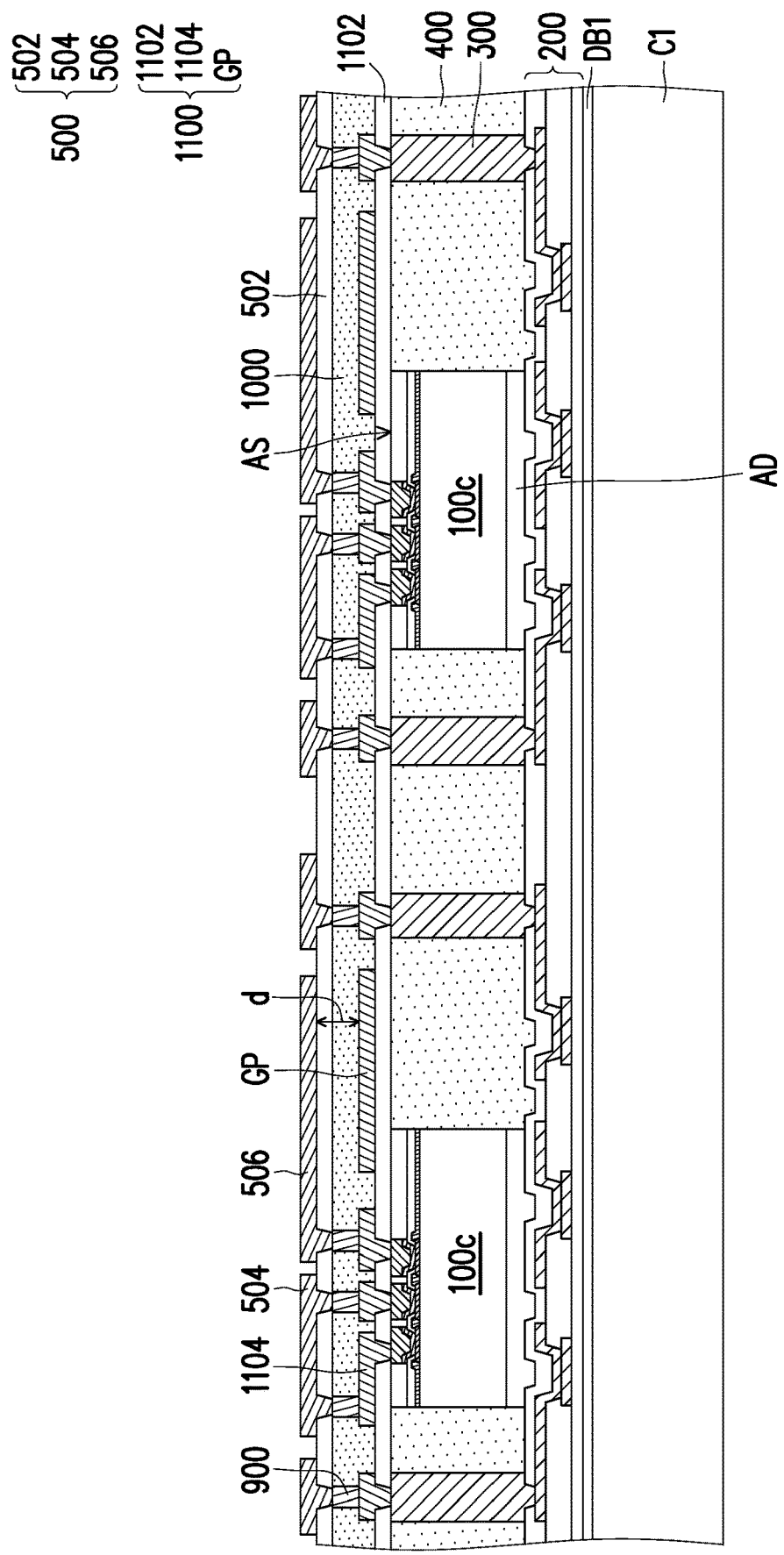
Figure 3N:
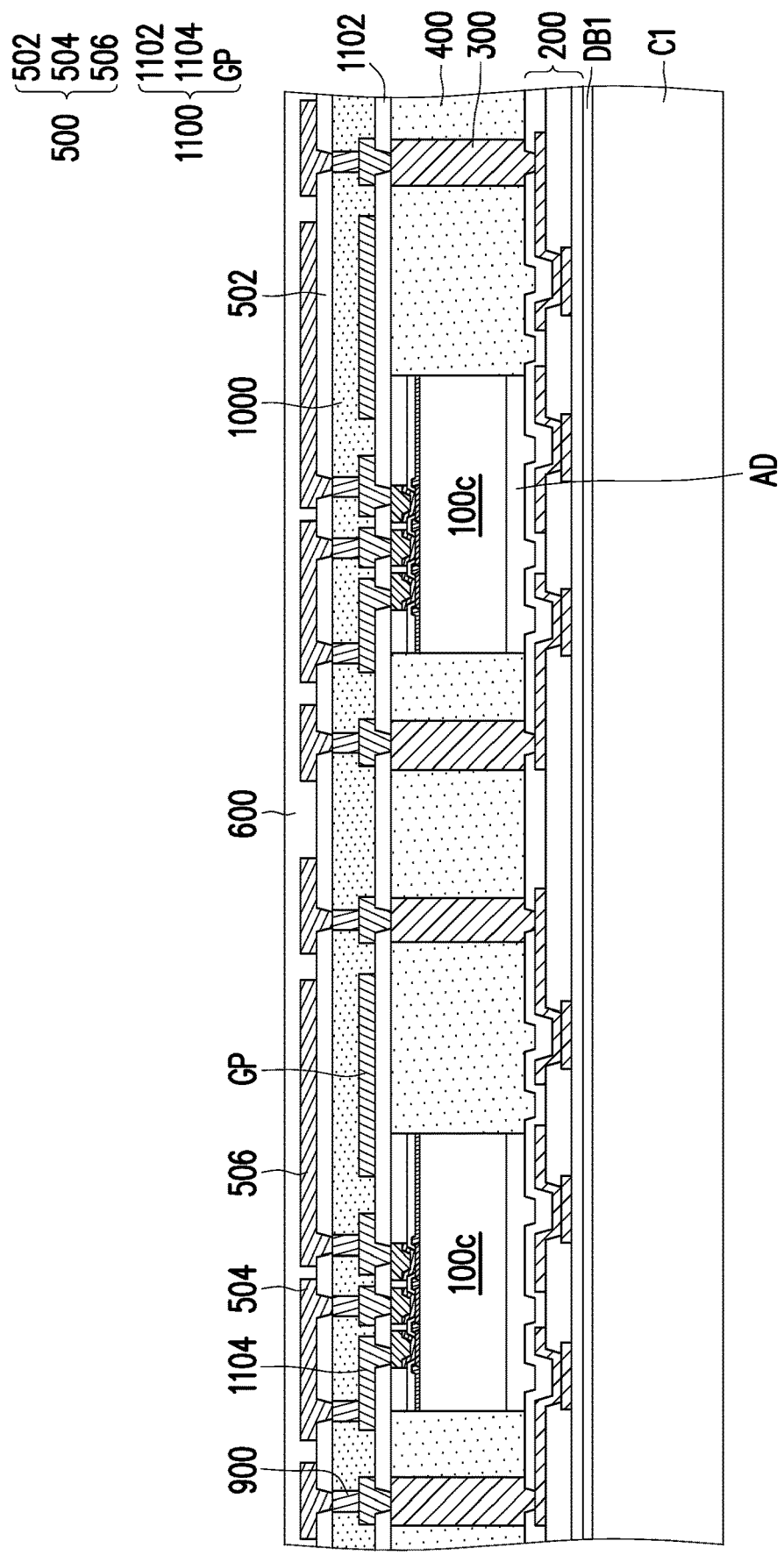
Figure 30:
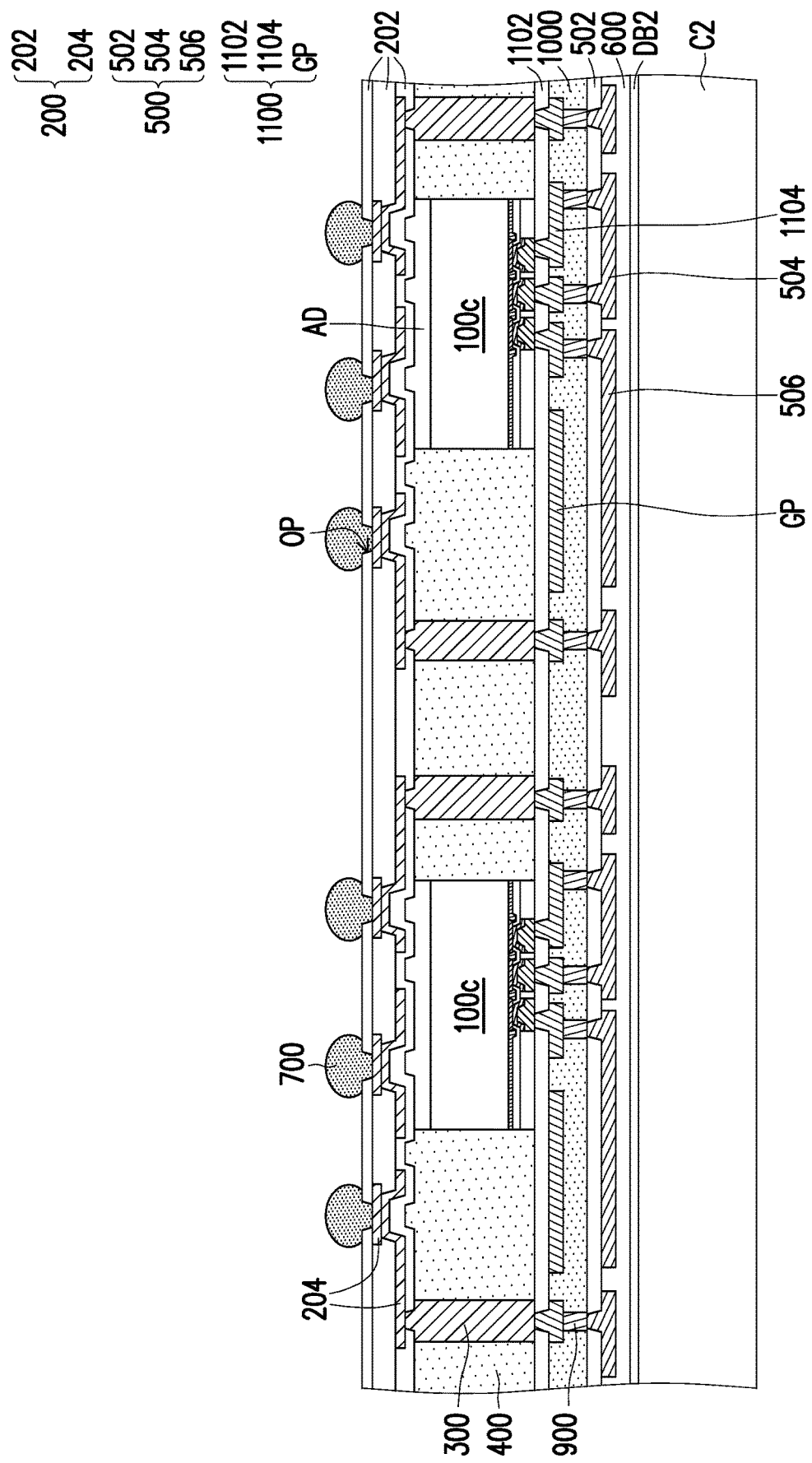
Figure 3P:
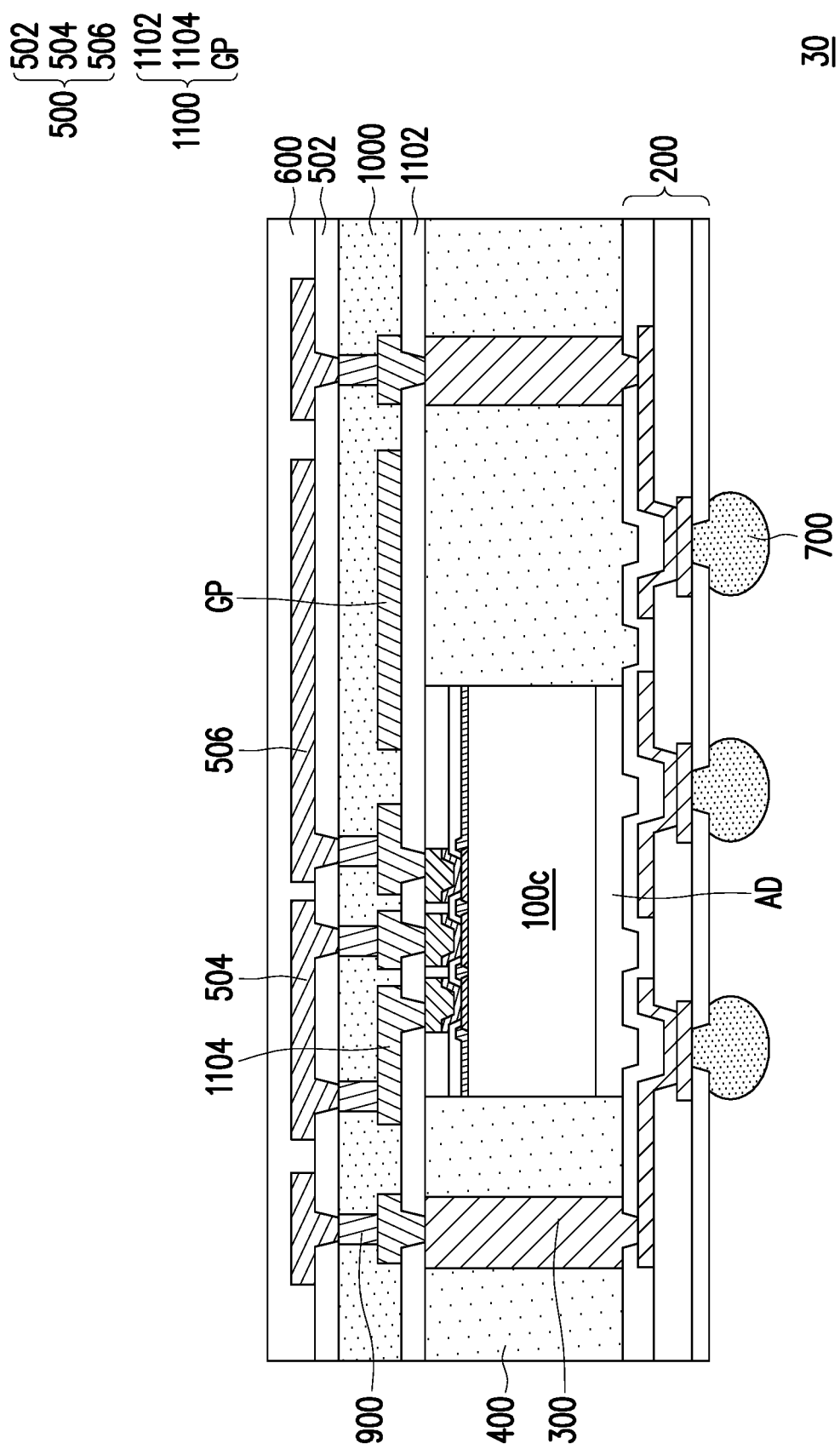

FIG. 3A to FIG. 3P are schematic cross-sectional views illustrating a manufacturing process of a package structure 30 in accordance with some alternative embodiments of the disclosure. The elements presented in FIG. 3A to FIG. 3P similar to the elements shown in FIG. 2A to FIG. 2L may be denoted by the same reference numeral as labelled in FIG. 2A to FIG. 2L. Referring to FIG. 3A, the step illustrated in FIG. 3A is similar to the steps illustrated in FIG. 2A, so the detailed descriptions thereof are omitted herein. For simplicity, the interconnection structure 120b and the dielectric layer 130 illustrated in FIG. 2A are not shown in FIG. 3A. However, it is understood that the structure illustrated in FIG. 3A also includes an interconnection structure and a dielectric layer located between the conductive pads 104 and the semiconductor wafer 110'.

Referring to FIG. 3B, a seed layer 172a is formed over the post-passivation layer 160 and the revealed portion of the conductive pads 140. In some embodiments, the seed layer 172a may be formed by a sputtering process or other suitable processes. In some embodiments, the seed layer 172a may be a titanium/copper composite layer. Thereafter, a photoresist layer PR is formed over the seed layer 172a. In some embodiments, the photoresist layer PR may be formed through spin-coating or the like. Then, a photolithography process is performed on the photoresist layer PR to render a plurality of openings. The openings of the photoresist layer PR expose the intended location for the subsequently formed elements. For example, as illustrated in FIG. 3B, the locations of the openings of the photoresist layer PR correspond to the locations of the conductive pads 140. That is, the seed layer 172a located directly above the conductive pads 140 and located in proximity to the conductive pads 140 is exposed by the photoresist layer PR.

Referring to FIG. 3C, the structure illustrated in FIG. 3B is immersed into a plating solution in a plating bath such that conductive material layer 172b is formed on the seed layer 172a exposed by the openings of the photoresist layer PR. In some embodiments, a material of the conductive material layer 172b includes aluminum, titanium, copper, nickel, tungsten, and/or alloys thereof.

Referring to FIG. 3D, after plating the conductive material layer 172b, the photoresist layer PR is removed. In some embodiments, the photoresist layer PR may be removed by a stripping process. Thereafter, portions of the seed layer 172a that are not covered by the conductive material layer 172b are removed through an etching process until the post-passivation layer 160 is revealed. The remaining seed layer 172a and the conductive material layer 172b then constitute a plurality of conductive posts 172. After the conductive posts 172 are formed on the conductive pads 140, a protection layer 180 is formed over the post-passivation layer 160 to encapsulate the conductive posts 172. The material and the formation method of the protection layer 180 in FIG. 3D may be similar to that of the protection layer 180 in FIG. 2B, so the detailed description thereof is omitted herein.

Referring to FIG. 3E, the step illustrated in FIG. 3E is similar to the step illustrated in FIG. 2C, so the detailed description thereof is omitted herein. Referring to FIG. 3E, upon singulating the structure illustrated in FIG. 3D, a plurality of dies 100c is obtained. In some embodiments, each die 100c includes the semiconductor substrate 110, the conductive pads 140, the passivation layer 150, the post-passivation layer 160, the conductive posts 172, and the protection layer 180. The conductive pads 140 are distributed over the semiconductor substrate 110. The passivation layer 150 and the post-passivation layer 160 are sequentially disposed on the conductive pads 140. The conductive posts 172 are formed to stand on the conductive pads 140. The protection layer 180 is formed to encapsulate the conductive posts 172.

Referring to FIG. 3F to FIG. 3G, the step illustrated in FIG. 3F to FIG. 3G are similar to the step illustrated in FIG. 2D to FIG. 2E, so the detailed descriptions thereof are omitted herein. As illustrated in FIG. 2E, each die 100c has an active surface AS opposite to the rear surface RS. The exposed portion of the conductive posts 172 is located on the active surface AS of the dies 100c. In some embodiments, top surfaces of the conductive structures 300, top surfaces of the conductive posts 172, and a top surface of the protection layer 180 are substantially coplanar with a top surface of the encapsulant 400.

Referring to FIG. 3H, a redistribution structure 1100 is formed on the dies 100c, the conductive structures 300, and the encapsulant 400. For example, the redistribution structure 1100 is formed over the active surface AS of the dies 100c. In some embodiments, the redistribution structure 1100 is electrically connected to the conductive posts 172 of the dies 100c and the conductive structures 300. The redistribution structure 1100 includes a dielectric layer 1102, a plurality of routing patterns 1104, and a plurality of ground patterns GP.

In some embodiments, the method of forming the redistribution structure 1100 includes the following steps. First, the dielectric layer 1102 is formed on the conductive structures 300, the dies 100c, and the encapsulant 400. In some embodiments, a material of the dielectric layer 1102 includes polyimide, epoxy resin, acrylic resin, phenol resin, BCB, PBO, or any other suitable polymer-based dielectric material. The dielectric layer 1102, for example, may be formed by suitable fabrication techniques such as spin-on coating, CVD, PECVD, or the like. Thereafter, a plurality of contact openings is formed in the dielectric layer 1102. The contact openings at least partially expose each conductive post 172 and each conductive structure 300. Then, a seed material layer (not shown) is formed over the dielectric layer 1102 and in the contact openings. The seed material layer extends into the contact openings to be in contact with the conductive posts 172 and the conductive structures 300. In some embodiments, the seed material layer includes a titanium/copper composite layer and is formed by a sputtering process. Then, a mask pattern (not shown) having openings is formed on the seed material layer. The openings of the mask pattern expose the intended location for the subsequently formed routing patterns 1104 and ground planes GP. Afterwards, a plating process is performed to form a conductive material layer on the seed material layer exposed by the openings of the mask pattern. In some embodiments, a material of the conductive material layer includes aluminum, titanium, copper, nickel, tungsten, and/or alloys thereof. The mask pattern and the underlying seed material layer are then removed by a stripping process and an etching process. The remaining seed material layer and the conductive material layer then constitute the routing patterns 1104 and the ground planes GP. In other words, the routing patterns 1104 and the ground planes GP are simultaneously formed. For example, the routing patterns 1104 and the ground planes GP may be formed by a same photolithography and etching process at the same time. As such, the ground planes GP and the routing patterns 1104 are located at a same level and are considered as a same layer.

In some embodiments, the ground planes GP are formed over the active surface AS of the dies 100c. That is, the ground planes GP are formed outside of the dies 100c. As illustrated in FIG. 3H, the ground planes GP are formed to extend from above the dies 100c to above the encapsulant 400. In some embodiments, the ground planes GP are electrically insulated from the routing patterns 1104. In some embodiments, the ground planes GP are electrically connected to a ground. It is noted that although one layer of the dielectric layer 1102 and one layer of the routing patterns 1104 are shown in FIG. 3H, the disclosure is not limited thereto. In some alternative embodiments, more layers of the dielectric layer 1102 and more layers of the routing patterns 1104 may be formed depending on the circuit design.

Referring to FIG. 3I, a plurality of through insulating vias 900 is formed on the routing patterns 1104 of the redistribution structure 1100. The material and the formation method of the through insulating vias 900 are similar to the through insulating vias 900 in FIG. 2F, so the detailed description thereof is omitted herein.

Referring to FIG. 3J, an insulating material 1000' is formed over the redistribution structure 1100 to cover the through insulating vias 900, the ground planes GP, and the routing patterns 1104. In some embodiments, the through insulating vias 900, the ground planes GP, and the routing patterns 1104 are not revealed and are well protected by the insulating material 1000'. In some embodiments, the insulating material 1000' may be selected from low Df and/or Dk materials to ensure the signal transmission quality. For example, the insulating material 1000' may include polymer, epoxy, the like, or a combination thereof.

Referring to FIG. 3J and FIG. 3K, a portion of the insulating material 1000' is removed. For example, the insulating material 1000' is grinded until top surfaces of the through insulating vias 900 are exposed. After the insulating material 1000' is grinded, an insulating layer 1000 is formed over the redistribution structure 1100 to encapsulate the through insulating vias 900, the routing patterns 1104, and the ground planes GP. In some embodiments, the insulating material 1000' is grinded by a mechanical grinding process and/or a chemical mechanical polishing (CMP) process. In some embodiments, during the grinding process of the insulating material 1000', portions of the through insulating vias 900 are slightly grinded as well. In some embodiments, the insulating layer 1000 laterally encapsulates sidewalls of the through insulating vias 900. In other words, the through insulating vias 900 are embedded in the insulating layer 1000. In some embodiments, top surfaces of the through insulating vias 900 are substantially coplanar with a top surface of the insulating layer 1000.

Referring to FIG. 3L to FIG. 3M, the steps illustrated in FIG. 3L to FIG. 3M are similar to the step illustrated in FIG. 2I, so the detailed descriptions thereof are omitted herein. Referring to FIG. 3M, a redistribution structure 500 is formed over the through insulating vias 900 and the insulating layer 1000. As illustrated in FIG. 3M, the insulating layer 1000 is located between the redistribution structure 500 and the redistribution structure 1100. The redistribution structure 500 includes a dielectric layer 502, a plurality of routing patterns 504, and a plurality of antenna patterns 506. In some embodiments, the routing patterns 504 and the antenna patterns 506 are simultaneously formed. In some embodiments, the routing patterns 504 are electrically connected to the dies 100c and the conductive structures 300 through the through insulating vias 900 and the routing patterns 1104. As such, signals originated from the dies 100c may be transmitted to the redistribution structure 200 sequentially through the routing patterns 1104, the through insulating vias 900, the routing patterns 504, and the conductive structures 300. On the other hand, the antenna patterns 506 are electrically connected to the die 100c through the through insulating vias 900 and the routing patterns 1104. In some embodiments, since the antenna patterns 506 are located on the active side (active surface AS) of the dies 100c, the signal outputs from the dies 100c may be transmitted to the antenna patterns 506 with a short travelling distance. In other words, the signal may be considered as a "direct feed" signal. For example, the signal outputs from the dies 100c may be transmitted to the antenna patterns 506 through the routing patterns 1104 and the through insulating vias 900. That is, in some embodiments, the routing patterns 1104 and the through insulating vias 900 may be collectively referred to as a feed line. Owing to the short travelling distance, the signal loss during travelling may be effectively reduced and the antenna efficiency may be sufficiently enhanced. Moreover, since the antenna patterns 506 are located on the active side of the dies 100c, the overall thickness of the subsequently formed package structure may be sufficiently reduced.

In some embodiments, the antenna patterns 506 are electrically coupled with the ground planes GP. In some embodiments, the antenna patterns 506 and the ground planes GP are at least partially overlapped along a direction perpendicular to an extending direction of the active surface AS of the dies 100c to achieve coupling. For example, as illustrate in FIG. 3M, a vertical projection of the antenna patterns 506 onto the dies 100c is overlapped with the ground planes GP. As mentioned above, the ground planes GP are formed to extend from above the dies 100c to above the encapsulant 400. Since the locations of the antenna patterns 506 depend on the configuration of the ground planes GP, the antenna patterns 506 may also extend from above the dies 100c to above the encapsulant 400. That is, the antenna area of the subsequently formed package structure may be adjustable based on package size, thereby rendering flexibility in circuit design and variation in applications.

In some embodiments, a distance d between the antenna patterns 506 and the ground planes GP ranges between 3 μm and 50 μm. Since the distance d between the ground planes GP and the antenna patterns 506 depends on the thickness of the redistribution structure 1100 and the through insulating vias 900, the distance d may be controllable based on the design of the redistribution structure 1100 and the through insulating vias 900. As such, various application with different antenna frequencies may be easily realized by adjusting the thicknesses of the redistribution structure 1100 and the through insulating vias 900.

Referring to FIG. 3N to FIG. 3P, the steps illustrated in FIG. 3N to FIG. 3P are similar to the steps illustrated in FIG. 2J to FIG. 1L, so the detailed descriptions thereof are omitted herein. Referring to FIG. 3P, a package structure 30 is obtained. In some embodiments, the package 30 may be referred to as an InFO package. However, the disclosure is not limited thereto. In some alternative embodiments, the package 30 may be other types of packages.

Figure 4A:
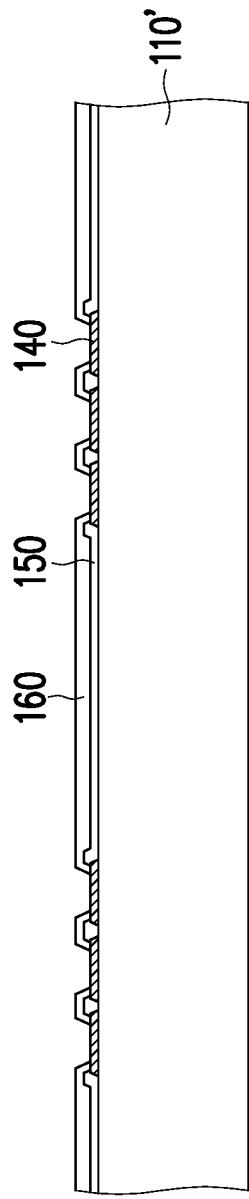
FIG. 4A to FIG. 4P are schematic cross-sectional views illustrating a manufacturing process of a package structure in accordance with some alternative embodiments of the disclosure.
Figure 4B:
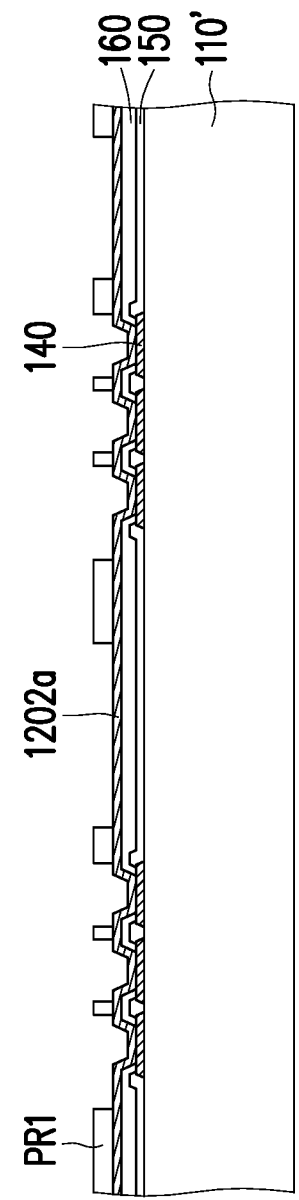
Figure 4C:
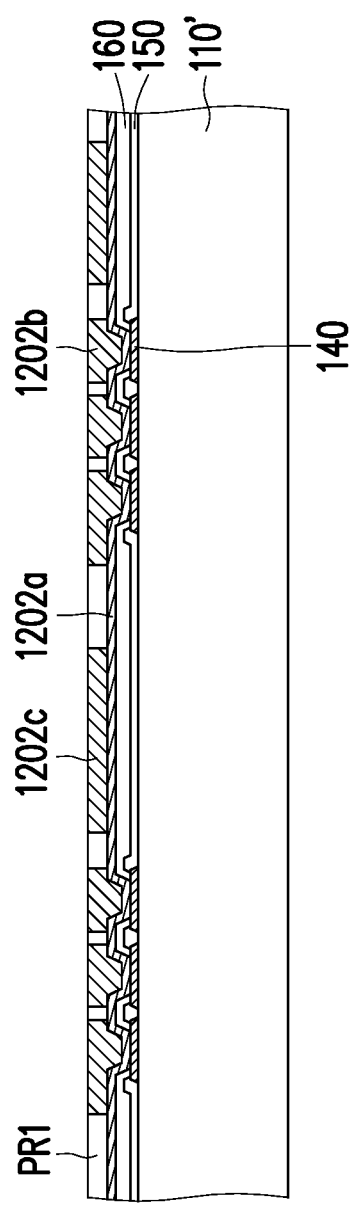
Figure 4D:
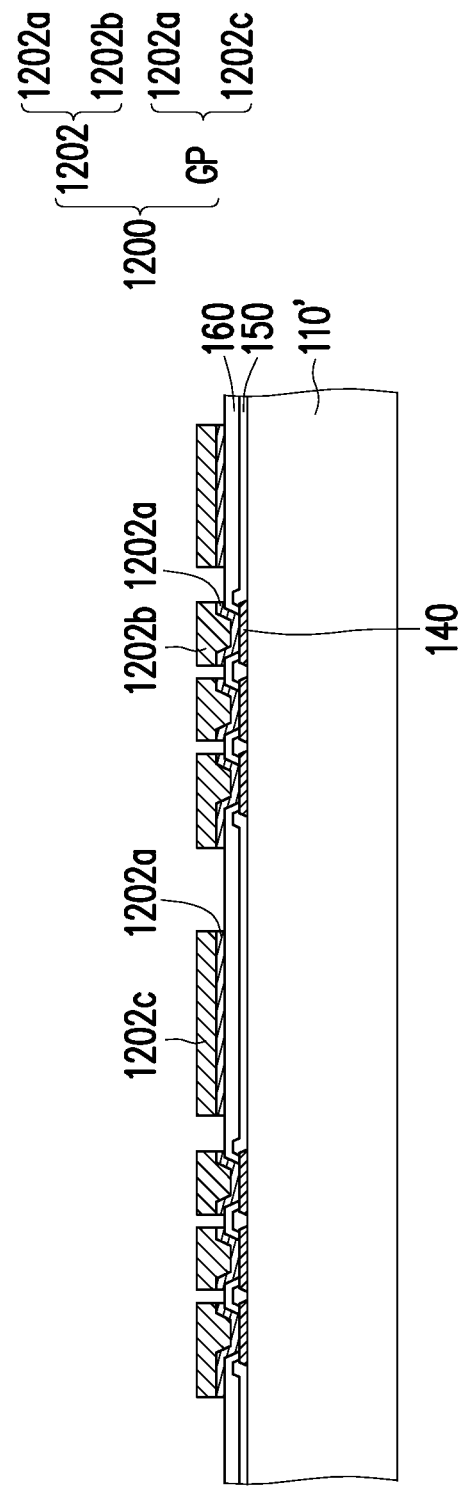
Figure 4E:
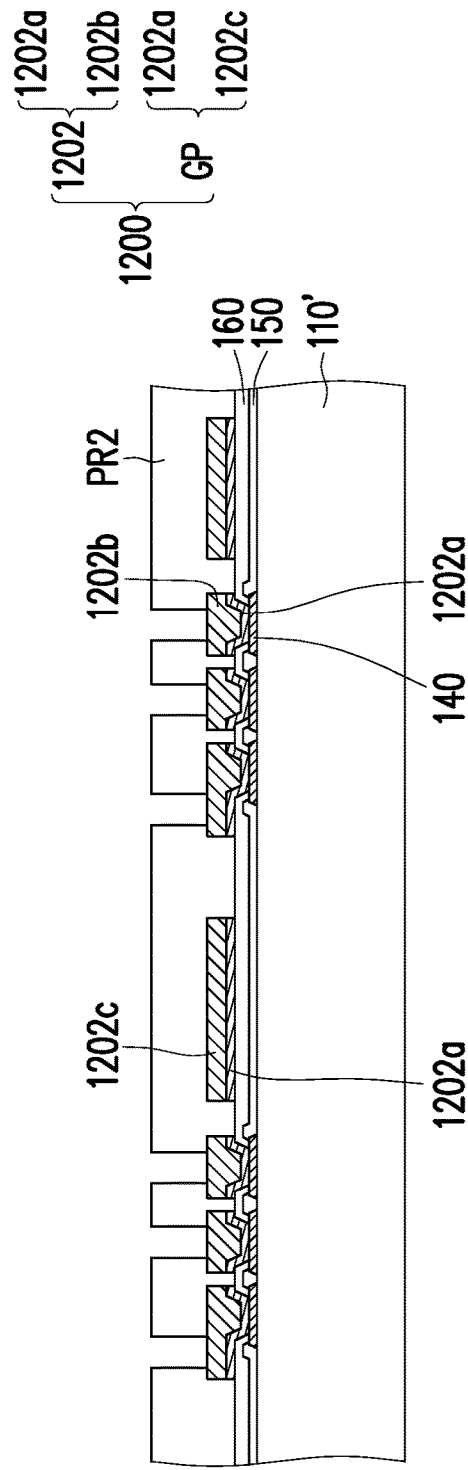
Figure 4F:
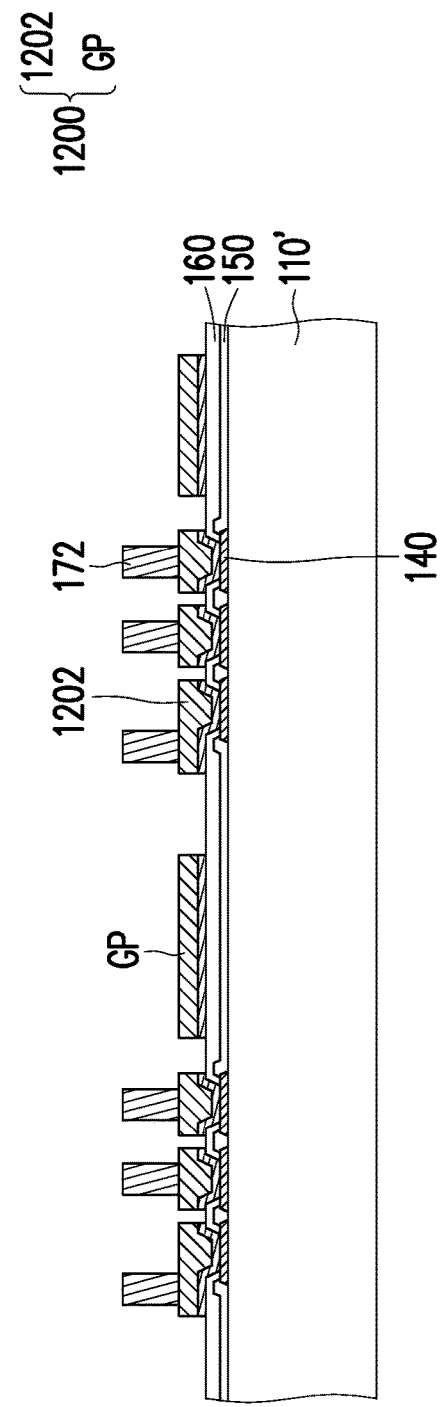
Figure 4G:
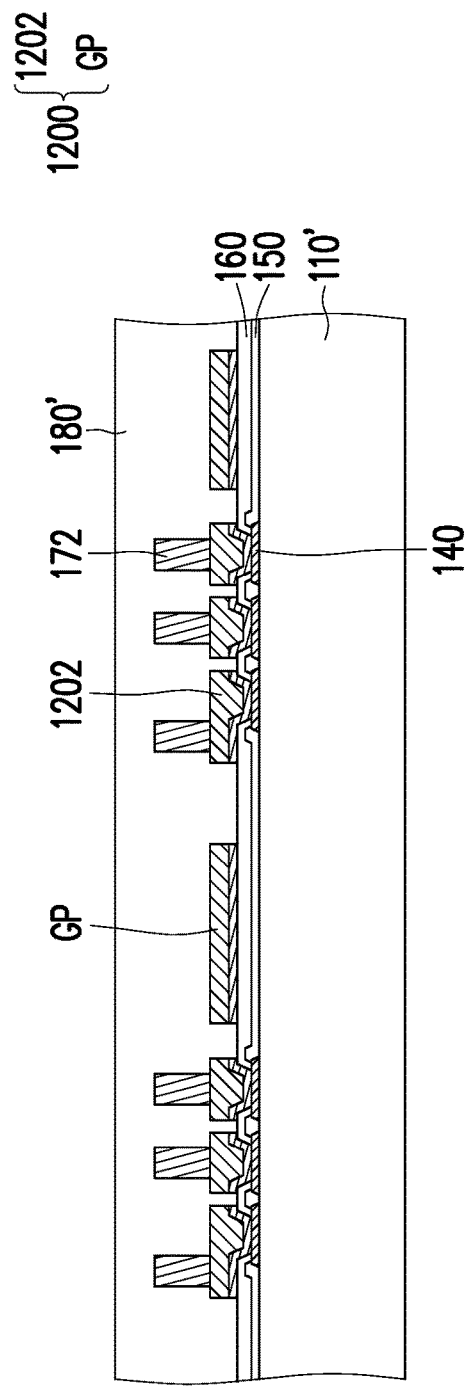
Figure 4H:
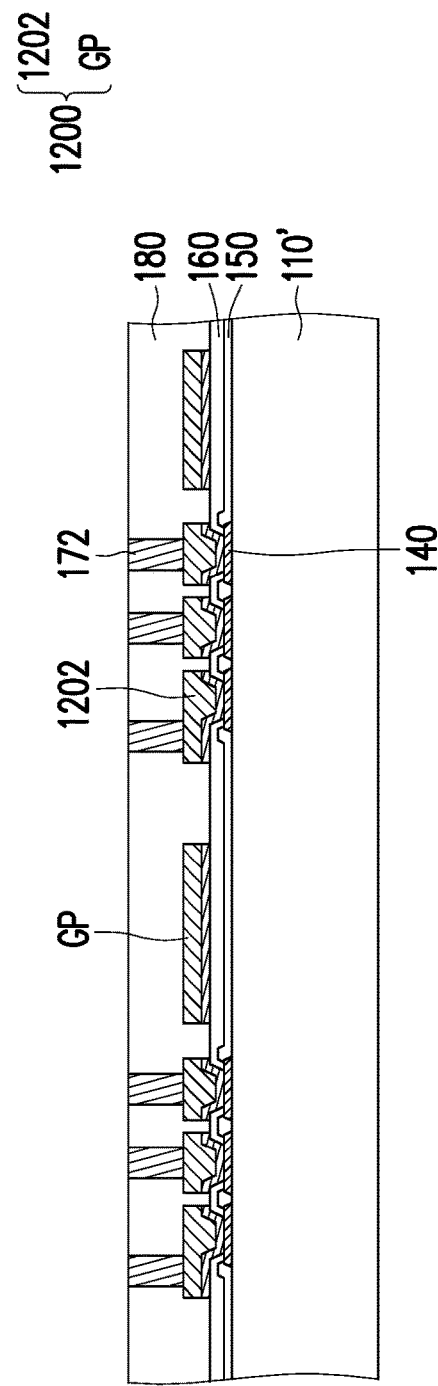
Figure 4I:
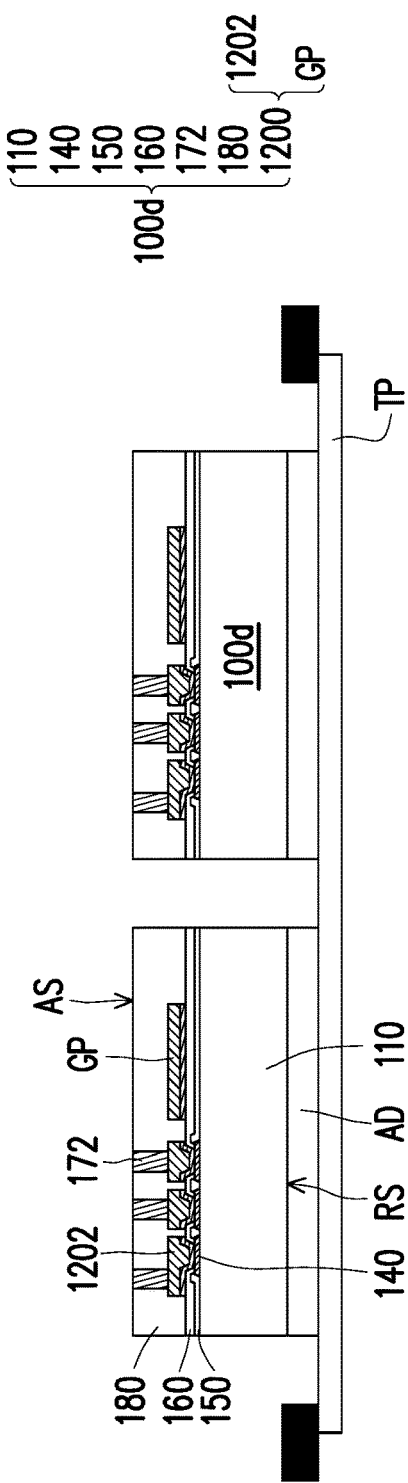
Figure 4J:
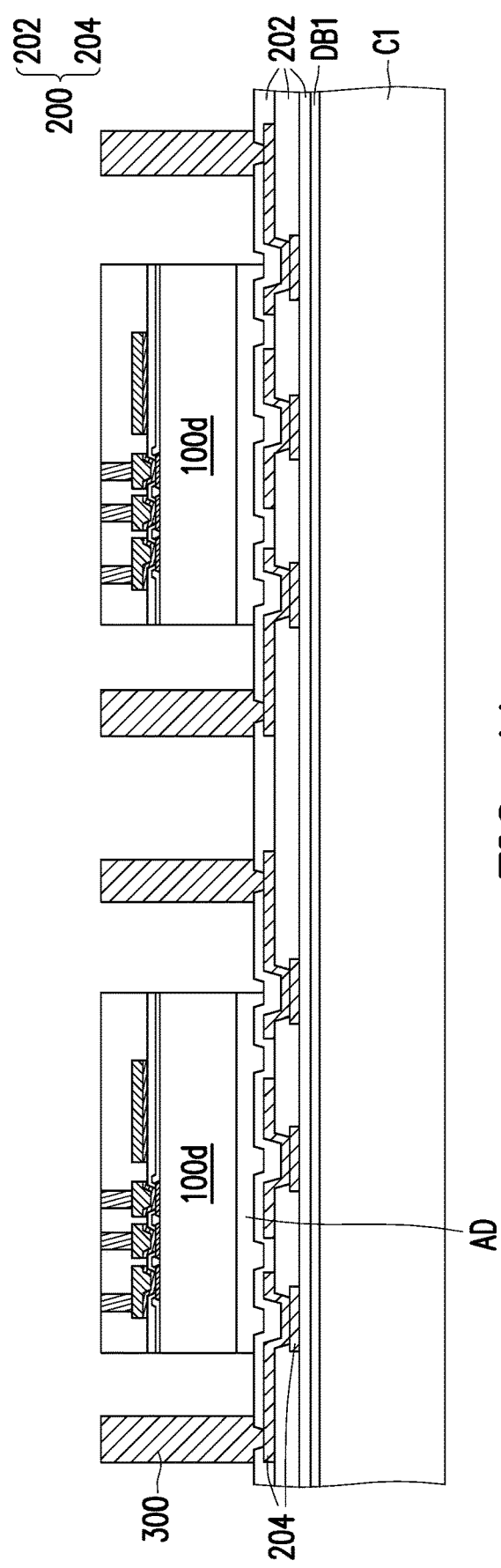
Figure 4K:
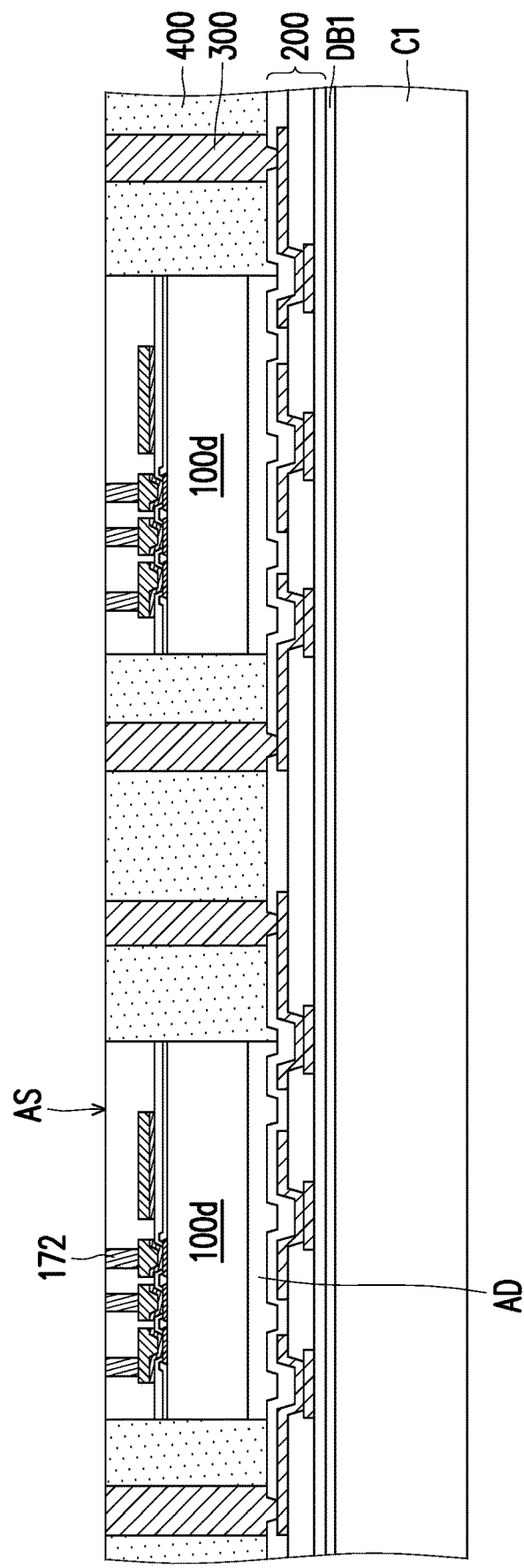
Figure 4L:
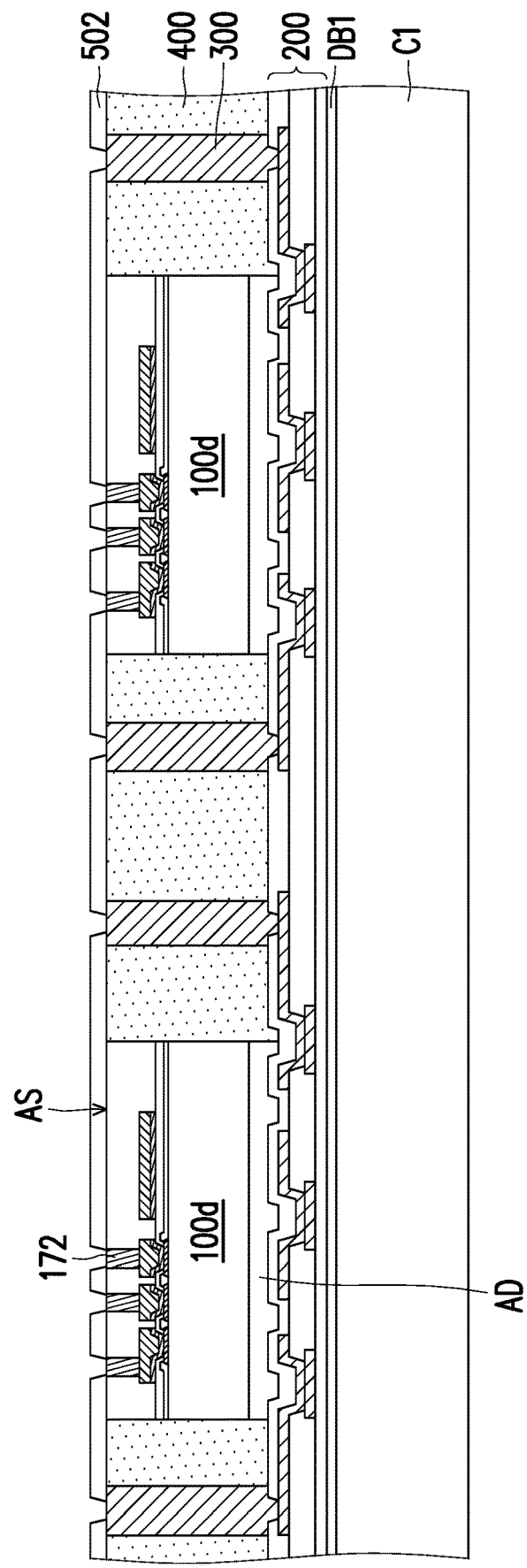
Figure 4M:
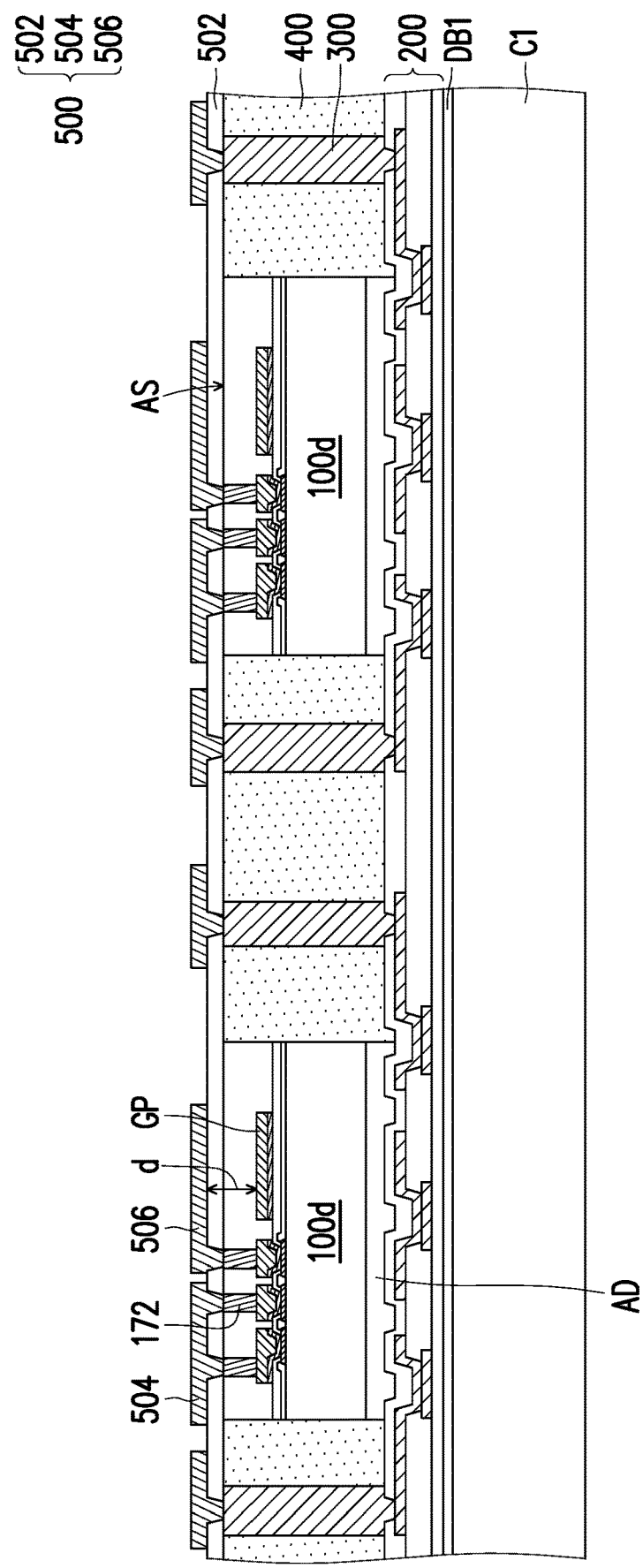
Figure 4N:
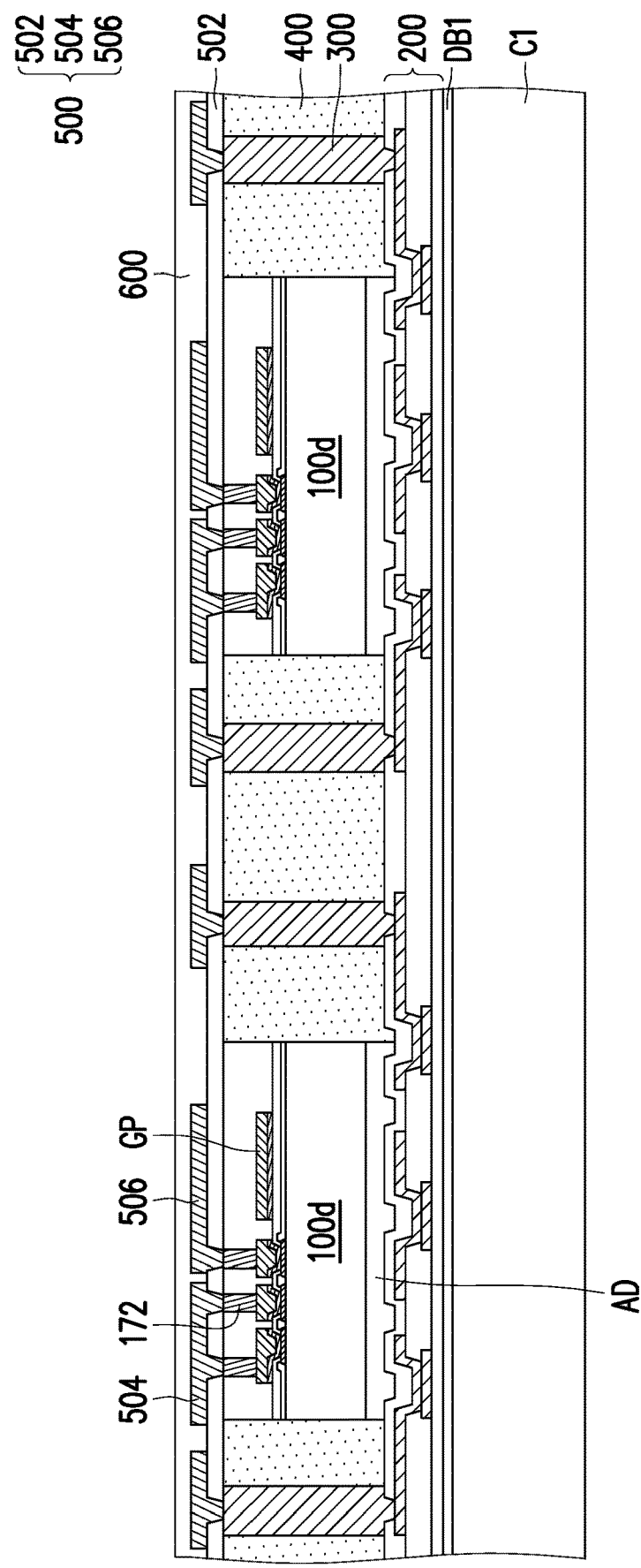
Figure 40:
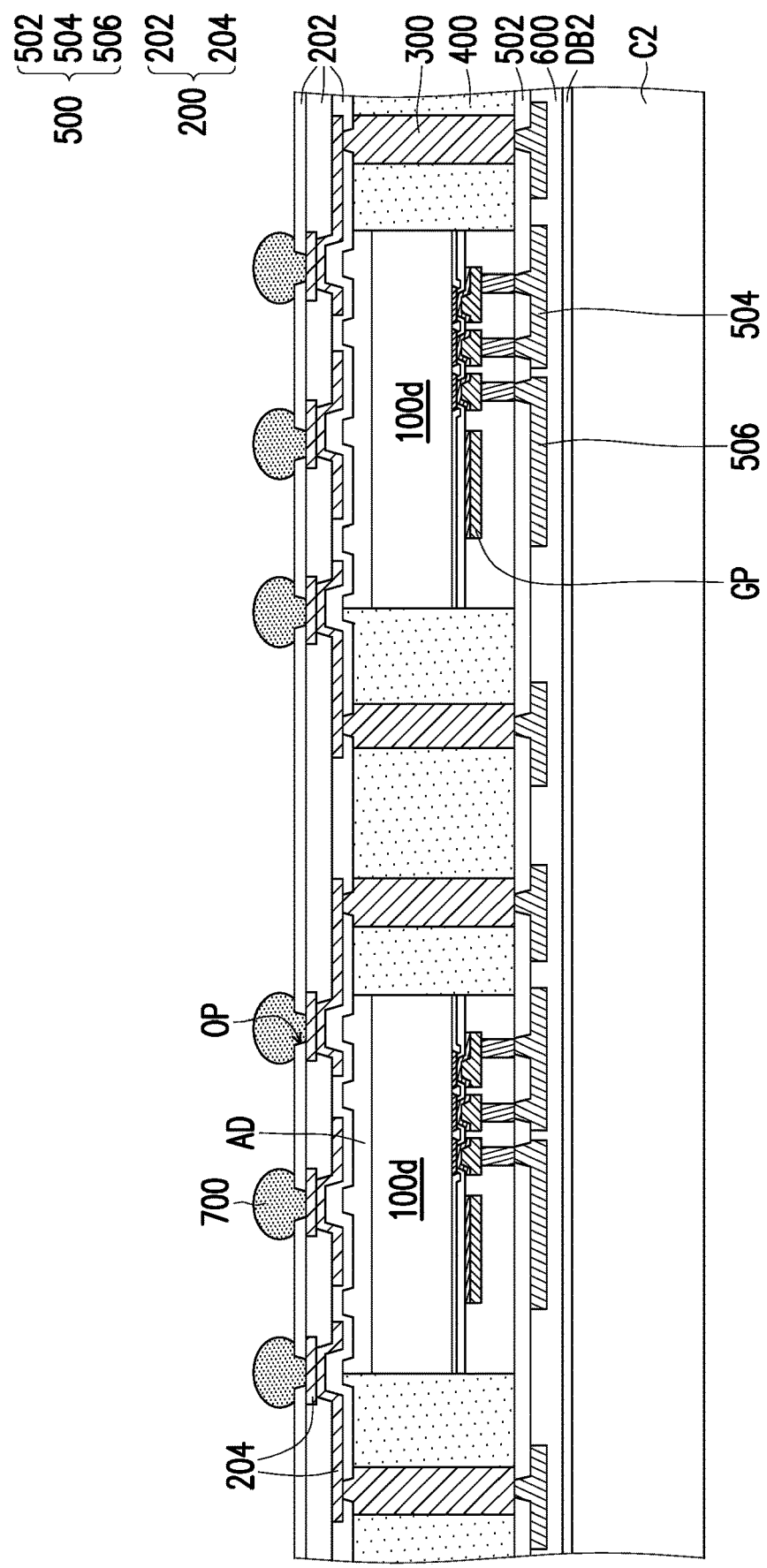
Figure 4P:
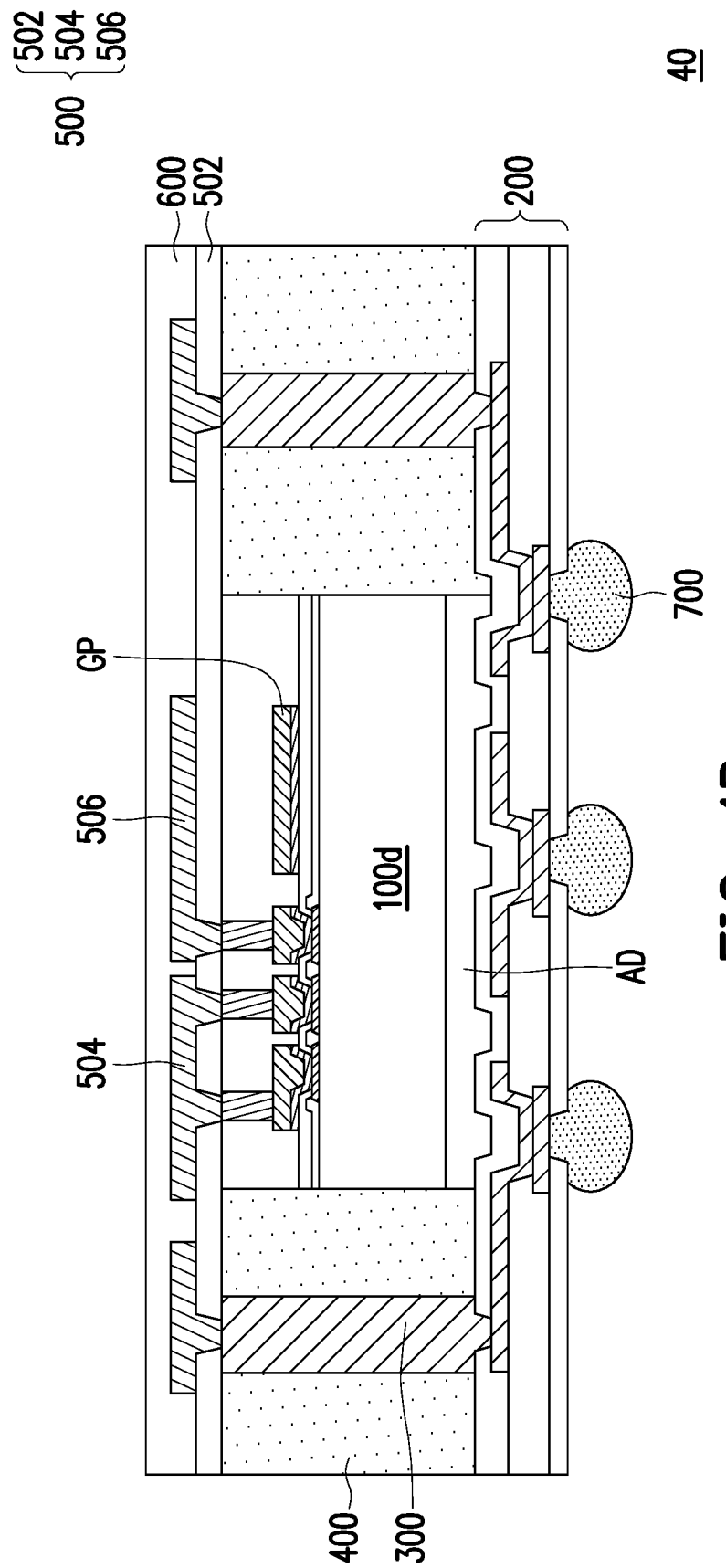

FIG. 4A to FIG. 4P are schematic cross-sectional views illustrating a manufacturing process of a package structure 40 in accordance with some alternative embodiments of the disclosure. The elements presented in FIG. 4A to FIG. 4P similar to the elements shown in FIG. 3A to FIG. 3P may be denoted by the same reference numeral as labelled in FIG.

3A to FIG. 3P. Referring to FIG. 4A, the step illustrated in FIG. 4A is similar to the steps illustrated in FIG. 3A, so the detailed descriptions thereof are omitted herein.

Referring to FIG. 4B, a seed layer 1202a is formed over the post-passivation layer 160 and the revealed portion of the conductive pads 140. In some embodiments, the seed layer 1202a may be formed by a sputtering process or other suitable processes. In some embodiments, the seed layer 1202a may be a titanium/copper composite layer. Thereafter, a photoresist layer PR1 is formed over the seed layer 1202a. In some embodiments, the photoresist layer PR1 may be formed through spin-coating or the like. Then, a photolithography process is performed on the photoresist layer PR1 to render a plurality of openings. The openings of the photoresist layer PR expose the intended location for the subsequently formed elements. For example, as illustrated in FIG. 4B, portions of the seed layer 1202a are exposed by the photoresist layer PR1.

Referring to FIG. 4C, the structure illustrated in FIG. 4B is immersed into a plating solution in a plating bath such that a first conductive material layer 1202b and a second conductive material layer 1202c are formed on the seed layer 1202a exposed by the openings of the photoresist layer PR1. In some embodiments, the first conductive material layer 1202b is formed on the seed layer 1202a located directly above the conductive pads 140 and the second conductive material layer 1202c is formed on the seed layer 1202a located directly above the post-passivation layer 160. In some embodiments, the first conductive material layer 1202b and the second conductive material layer 1202c are simultaneously formed. In some embodiments, a material of the first conductive material layer 1202b and the second conductive material layer 1202c includes aluminum, titanium, copper, nickel, tungsten, and/or alloys thereof.

Referring to FIG. 4D, after plating the first conductive material layer 1202b and the second conductive material layer 1202c, the photoresist layer PR1 is removed. In some embodiments, the photoresist layer PR1 may be removed by a stripping process. Thereafter, portions of the seed layer 1202a that are not covered by the first conductive material layer 1202b and the second conductive material layer 1202c are removed through an etching process until the post-passivation layer 160 is revealed. In some embodiments, the first conductive material layer 1202b and the underlying seed layer 1202a constitute a plurality of wiring patterns 1202. On the other hand, the second conductive material layer 1202c and the underlying seed layer 1202a constitute a plurality of ground planes GP. In other words, the wiring patterns 1202 and the ground planes GP are simultaneously formed. For example, the wiring patterns 1202 and the ground planes GP may be formed by a same photolithography and etching process at the same time. As such, the ground planes GP and the wiring patterns 1202 are located at a same level and are considered as a same layer. As illustrated in FIG. 4D, the wiring patterns 1202 are located directly above the conductive pads 140 and the ground planes GP are located directly above the post-passivation layer 160. In some embodiments, the ground planes GP are electrically insulated from the wiring patterns 1202. In some embodiments, the ground planes GP are electrically connected to a ground. In some embodiments, the wiring patterns 1202 and the ground planes GP may be collectively referred to as a wiring layer 1200. That is, the wiring layer 1200 is formed over the conductive pads 140 and the post-passivation layer 160.

Referring to FIG. 4E, a photoresist layer PR2 is formed over the wiring layer 1200. In some embodiments, the photoresist layer PR2 may be formed through spin-coating or the like. Thereafter, a photolithography process is performed on the photoresist layer PR2 to render a plurality of openings. The openings of the photoresist layer PR2 expose the intended location for the subsequently formed elements. As illustrated in FIG. 4E, the openings of the photoresist layer PR2 expose portion of the wiring patterns 1202. On the other hand, the ground planes GP are well protected by the photoresist layer PR2.

Referring to FIG. 4F, a plurality of conductive posts 172 is formed on the wiring patterns 1202. That is, the wiring layer 1200 is sandwiched between the conductive pads 140 and the conductive posts 172. In some embodiments, the conductive posts 172 may be formed by the following steps. First, a conductive material layer (not shown) is plated on portions of the wiring patterns exposed by the openings of the photoresist layer PR2. The conductive material layer includes aluminum, titanium, copper, nickel, tungsten, and/or alloys thereof. Subsequently, the photoresist layer PR2 is removed to render the conductive posts 172 standing on the wiring patterns 1202 of the wiring layer 1200.

Referring to FIG. 4G, a protection material layer 180' is formed over the post-passivation layer 160 to encapsulate the conductive posts 172, the wiring patterns 1202, and the ground planes GP. For example, the conductive posts 172, the wiring patterns 1202, and the ground planes GP are well protected by the protection material layer 180' and are not revealed. In some embodiments, a material of the protection material layer 180' has a low dissipation factor (DO and/or a low permittivity (Dk). Depending on the frequency range of the high-speed application, suitable material for the protection material layer 180' may be selected based on the required electrical properties of the subsequently formed package structure. For example, the protection material layer 180' may include polymer, epoxy, the like, or a combination thereof. In some embodiments, the protection material layer 180' is formed by a suitable fabrication technique, such as spin-coating, lamination, deposition, molding, or the like.

Referring to FIG. 4H, a portion of the protection material layer 180' is removed. For example, the protection material layer 180' is grinded until top surfaces of the conductive posts 172 are exposed. After the protection material layer 180' is grinded, a protection layer 180 is formed over the post-passivation layer 160 to encapsulate the conductive posts 172, the routing patterns 1202, and the ground planes GP. In some embodiments, the protection material layer 180' is grinded by a mechanical grinding process and/or a chemical mechanical polishing (CMP) process. In some embodiments, during the grinding process of the protection material layer 180', portions of the conductive posts 172 are slightly grinded as well. In some embodiments, the protection layer 180 laterally encapsulates sidewalls of the conductive posts 172. In other words, the conductive posts 172 are embedded in the protection layer 180. In some embodiments, top surfaces of the conductive posts 172 are substantially coplanar with a top surface of the protection layer 180.

Referring to FIG. 4I, the step illustrated in FIG. 4I is similar to the step illustrated in FIG. 3E, so the detailed description thereof is omitted herein. Referring to FIG. 4I, upon singulating the structure illustrated in FIG. 4H, a plurality of dies 100d is obtained. In some embodiments, each die 100d includes the semiconductor substrate 110, the conductive pads 140, the passivation layer 150, the post-passivation layer 160, the conductive posts 172, the protection layer 180, and the wiring layer 1200. The conductive pads 140 are distributed over the semiconductor substrate 110. The passivation layer 150 and the post-passivation layer 160 are sequentially disposed on the conductive pads 140. The wiring layer 1200 is formed on the post-passivation layer 160. In some embodiments, the wiring layer 1200 includes the wiring patterns 1202 and the ground planes GP. That is, the ground planes GP are within the die 100d and are over the conductive pads 140. The conductive posts 172 are formed to stand on the wiring patterns 1202 of the wiring layer 1200. The protection layer 180 is formed to encapsulate the conductive posts 172 and the wiring layer 1200.

Referring to FIG. 4J and FIG. 4K, the steps illustrated in FIG. 4J and FIG. 4K are similar to the steps illustrated in FIG. 3F and FIG. 3G, so the detailed descriptions thereof are omitted herein. As illustrated in FIG. 4K, top surfaces of the conductive structures 300, top surfaces of the conductive posts 172, and a top surface of the protection layer 180 are substantially coplanar with a top surface of the encapsulant 400.

Referring to FIG. 4L and FIG. 4M, the steps illustrated in FIG. 4J and FIG. 4K are similar to the steps illustrated in FIG. 3L and FIG. 3M, so the detailed descriptions thereof are omitted herein. Referring to FIG. 4M, a redistribution structure 500 is formed over the dies 100d, the conductive structures 300, and the encapsulant 400. The redistribution structure 500 includes a dielectric layer 502, a plurality of routing patterns 504, and a plurality of antenna patterns 506. In some embodiments, the routing patterns 504 and the antenna patterns 506 are simultaneously formed. In some embodiments, the routing patterns 504 are electrically connected to the dies 100d and the conductive structures 300. For example, the conductive posts 172 of the dies 100d and the conductive structure 300 may be directly in contact with the redistribution structure 500. As such, signals originated from the dies 100d may be transmitted to the redistribution structure 200 sequentially through routing patterns 504 and the conductive structures 300. On the other hand, the antenna patterns 506 are electrically connected to the dies 100d. In some embodiments, since the antenna patterns 506 are located on the active side (active surface AS) of the dies 100d, the signal outputs from the dies 100d may be transmitted to the antenna patterns 506 with a short travelling distance. In other words, the signal may be considered as a "direct feed" signal. Owing to the short travelling distance, the signal loss during travelling may be effectively reduced and the antenna efficiency may be sufficiently enhanced. Moreover, since the antenna patterns 506 are located on the active side of the dies 100d, the overall thickness of the subsequently formed package structure may be sufficiently reduced. In some embodiments, the antenna patterns 506 are electrically coupled with the ground planes GP. In some embodiments, the antenna patterns 506 and the ground planes GP are at least partially overlapped along a direction perpendicular to an extending direction of the active surface AS of the dies 100d to achieve coupling. For example, as illustrate in FIG. 4M, a vertical projection of the antenna patterns 506 onto the dies 100d is overlapped with the ground planes GP.

In some embodiments, a distance d between the antenna patterns 506 and the ground planes GP ranges between 3 μm and 50 μm. Since the distance d between the ground planes GP and the antenna patterns 506 depends on the thickness of the conductive posts 172, the distance d may be controllable based on the design of the conductive posts 172. As such, various application with different antenna frequencies may be easily realized by adjusting the thicknesses of the conductive posts 172.

Referring to FIG. 4N to FIG. 4P, the steps illustrated in FIG. 4N to FIG. 4P are similar to the steps illustrated in FIG. 3N to FIG. 3P, so the detailed descriptions thereof are omitted herein. Referring to FIG. 4P, a package structure 40 is obtained. In some embodiments, the package 40 may be referred to as an InFO package. However, the disclosure is not limited thereto. In some alternative embodiments, the package 40 may be other types of packages.

In accordance with some embodiments of the disclosure, a package structure includes a die, an encapsulant, and a first redistribution structure. The die has an active surface and a rear surface opposite to the active surface. The die includes a ground plane within the die. The encapsulant encapsulates the die. The first redistribution structure is over the active surface of the die. The first redistribution structure includes an antenna pattern electrically coupled with the ground plane. The antenna pattern is electrically connected to the die.

In accordance with some alternative embodiments of the disclosure, a manufacturing method of a package structure includes at least the following steps. A die is formed. The die is encapsulated by an encapsulant. A first redistribution structure is formed over the die. The die is formed by at least the following steps. A semiconductor wafer is provided. A plurality of conductive pads are formed over the semiconductor wafer. A ground plane is formed over the conductive pads. The first redistribution structure is formed by at least the following steps. A dielectric layer is formed. An antenna pattern and a plurality of routing patterns are formed on the dielectric layer. The antenna pattern electrically couples with the ground plane.

In accordance with some embodiments of the disclosure, a manufacturing method of a package structure includes at least the following steps. A carrier is provided. A first redistribution structure is formed over the carrier. A die is placed over the first redistribution structure. The die is encapsulated by the encapsulant. A second redistribution structure is formed over an active surface of the die. The second redistribution structure is formed by simultaneously forming a ground plane and a plurality of first routing patterns. A plurality of through insulating vias is formed on the first routing patterns of the second redistribution structure. The through insulating vias are encapsulated by an insulating layer. A third redistribution structure is formed over the through insulating vias and the insulating layer. The third redistribution structure is formed by simultaneously forming an antenna pattern and a plurality of second routing patterns. The antenna pattern electrically couples with the ground plane.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A package structure, comprising:
    a die having an active surface and a rear surface opposite to the active surface, wherein the die comprises:
        a semiconductor substrate;

a ground plane within the die, the ground plane is below the active surface of the die, and the ground plane is completely located within a span of the semiconductor substrate;
an encapsulant encapsulating the die; and
a first redistribution structure over the active surface of the die and directly contacting the encapsulant, wherein the first redistribution structure comprises an antenna pattern electrically coupled with the ground plane, and the antenna pattern is electrically connected to the die.

2. The package structure according to claim 1, further comprising a plurality of conductive structures surrounding the die, wherein the plurality of conductive structures penetrates through the encapsulant.

3. The package structure according to claim 1, further comprising:
a second redistribution structure over the rear surface of the die; and
a plurality of conductive terminals over the second redistribution structure.

4. The package structure according to claim 1, wherein the die further comprises:
an interconnection structure on the semiconductor substrate, wherein the interconnection structure comprises the ground plane;
a plurality of conductive pads over and electrically connected to portions of the interconnection structure; and
a plurality of conductive posts standing on the plurality of conductive pads, wherein the plurality of conductive posts are electrically connected to the first redistribution structure.

5. The package structure according to claim 1, wherein the die further comprises:
a plurality of conductive pads distributed over the semiconductor substrate;
a wiring layer over the plurality of conductive pads, wherein the wiring layer comprises a plurality of wiring patterns and the ground plane;
a plurality of conductive posts standing on the plurality of wiring patterns, wherein the plurality of conductive posts are directly in contact with the first redistribution structure; and
a protection layer encapsulating the wiring layer and the plurality of conductive posts.

6. The package structure according to claim 5, wherein sidewalls of the protection layer are aligned with sidewalls of the semiconductor substrate.

7. The package structure according to claim 5, wherein the ground plane is located between the active surface and the semiconductor substrate.

8. The package structure according to claim 5, wherein top surfaces of the plurality of conductive posts are substantially coplanar with a top surface of the encapsulant.

9. The package structure according to claim 5, wherein a top surface of the protection layer, top surfaces of the plurality of conductive posts, and a top surface of the encapsulant are substantially coplanar.

10. A manufacturing method of a package structure, comprising:
forming a die, comprising:
providing a semiconductor wafer;
forming a plurality of conductive pads over the semiconductor wafer;
forming a ground plane over the plurality of conductive pads, wherein the die has an active surface and a rear surface opposite to the active surface, and the ground plane is below the active surface of the die; and
singulating the semiconductor wafer to divide the semiconductor wafer into semiconductor substrates, wherein the ground plane is completely located within a span of at least one of the semiconductor substrates;
encapsulating the die by an encapsulant; and
forming a first redistribution structure over the die and directly contacting the encapsulant, comprising:
forming a dielectric layer; and
forming an antenna pattern and a plurality of routing patterns on the dielectric layer, wherein the antenna pattern electrically couples with the ground plane.

11. The method according to claim 10, further comprising:
forming a plurality of conductive structures surrounding the die, wherein the plurality of conductive structures penetrates through the encapsulant.

12. The method according to claim 10, further comprising:
forming a second redistribution structure over the die opposite to the first redistribution structure; and
forming a plurality of conductive terminals over the second redistribution structure.

13. The method according to claim 10, wherein forming the die further comprises:
forming an interconnection structure between the semiconductor wafer and the plurality of conductive pads.

14. The method according to claim 10, wherein forming the die further comprises:
forming a plurality of wiring patterns on the plurality of conductive pads, wherein the ground plane and the plurality of wiring patterns are simultaneously formed;
forming a plurality of conductive posts on the plurality of wiring patterns; and
forming a protection layer to encapsulate the plurality of conductive posts, the plurality of wiring patterns, and the ground plane.

15. A package structure, comprising:
a die, comprising:
a semiconductor substrate;
a plurality of conductive pads distributed over the semiconductor substrate;
a plurality of wiring patterns disposed on and electrically connected to the conductive pads;
a ground plane, wherein the plurality of the wiring patterns and the ground plane are located at a same level; and
a plurality of conductive posts standing on the plurality of wiring patterns;
an encapsulant laterally encapsulating the die; and
a redistribution structure over the die and the encapsulant, wherein the redistribution structure comprises an antenna pattern electrically coupled with the ground plane.

16. The package structure according to claim 15, wherein top surfaces of the plurality of conductive posts are substantially coplanar with a top surface of the encapsulant.

17. The package structure according to claim 15, wherein each wiring pattern comprises a seed layer directly in contact with the corresponding conductive pad and a conductive material layer disposed on the seed layer.

18. The package structure according to claim 15, wherein the die further comprises a post-passivation layer over the plurality of conductive pads, the post-passivation layer has a plurality of contact openings partially exposing each of the plurality of conductive pads, and the ground pattern comprises a seed layer directly in contact with the post-passivation layer and a conductive material layer disposed on the seed layer.

19. The package structure according to claim 15, wherein the die further comprises a protection layer encapsulating the plurality of wiring patterns, the ground plane, and the plurality of conductive posts, and a top surface of the protection layer, top surfaces of the plurality of conductive posts, and a top surface of the encapsulant are substantially coplanar.

20. The package structure according to claim 15, wherein the redistribution structure further comprises a plurality of routing patterns, and the plurality of conductive posts are directly in contact with the plurality of routing patterns and the antenna pattern.

* * * * *